(12) United States Patent
Drodofsky et al.

(10) Patent No.: US 7,957,431 B2
(45) Date of Patent: Jun. 7, 2011

(54) NOT TEMPERATURE STABILIZED PULSED LASER DIODE AND ALL FIBRE POWER AMPLIFIER

(75) Inventors: Ulrich Drodofsky, Berneck (CH); Marcel Zeller, Balgach (CH)

(73) Assignee: Vectronix AG, Heerbrugg (CH)

( * ) Notice: Subject to any disclaimer, the term of this patent is extended or adjusted under 35 U.S.C. 154(b) by 441 days.

(21) Appl. No.: 11/721,864

(22) PCT Filed: Sep. 30, 2005

(86) PCT No.: PCT/CH2005/000569
§ 371 (c)(1),
(2), (4) Date: Jul. 3, 2008

(87) PCT Pub. No.: WO2006/063475
PCT Pub. Date: Jun. 22, 2006

(65) Prior Publication Data
US 2008/0259974 A1  Oct. 23, 2008

(30) Foreign Application Priority Data
Dec. 16, 2004 (EP) .................................. 04029867
Jan. 14, 2005 (EP) .................................. 05000669

(51) Int. Cl.
*H01S 3/30* (2006.01)
*H01S 3/08* (2006.01)

(52) U.S. Cl. .......................................... 372/6; 372/108

(58) Field of Classification Search ............... 372/6, 108, 372/18, 19
See application file for complete search history.

(56) References Cited

U.S. PATENT DOCUMENTS

| | | | |
|---|---|---|---|
| 3,610,755 | A | 10/1971 | Wieberger |
| 5,319,434 | A | 6/1994 | Croteau et al. |
| 5,812,712 | A | 9/1998 | Pan |
| 5,933,271 | A | 8/1999 | Waarts et al. |
| 6,049,414 | A | 4/2000 | Espindola et al. |
| 6,141,086 | A | 10/2000 | Vahala et al. |
| 6,151,157 | A | 11/2000 | Ball et al. |
| 6,347,007 | B1 | 2/2002 | Grubb et al. |
| 6,456,428 | B1 | 9/2002 | Nakaji et al. |
| 6,687,049 | B1 | 2/2004 | Sulhoff et al. |

(Continued)

FOREIGN PATENT DOCUMENTS
EP  1 003 253 A2  5/2000
(Continued)

OTHER PUBLICATIONS

Cladding-mode assisted fiber-to-fiber and fiber-to-free-space coupling; Yufeng Li, Turan Erdogan, Sep. 15, 2000; pp. 377-388.

(Continued)

*Primary Examiner* — Armando Rodriguez
(74) *Attorney, Agent, or Firm* — Antonelli, Terry, Stout & Kraus, LLP.

(57) ABSTRACT

A laser system has an output/input coupler unit (49) with a circulator (37). An output of the circulator (37) is operationally connected to a detector unit (43). The input/output ($EA_{37}$) of the circulator is operationally connected to a transmitter and a receiver optics 41. Laser light is input to the circulator ($E_{37}$). The input ($E_{37}$), output ($A_{37}$) and output/input ($EA_{37}$) of the circulator are optical fibers. The pulsed diode (3) is not temperature stabilized. To reduce amplified spontaneous emission (ASE) generated in the optical fiber amplifier (9), a narrow band-pass filter unit (29) is used. Filter unit (29) has a central wavelength with a temperature dependence which is matched to the temperature dependent wavelength shift of the pulsed diode (3).

33 Claims, 8 Drawing Sheets

U.S. PATENT DOCUMENTS

| | | | |
|---|---|---|---|
| 6,721,089 | B1 | 4/2004 | Miller et al. |
| 2002/0075472 | A1 | 6/2002 | Holton et al. |
| 2002/0114066 | A1 | 8/2002 | Nakaji |
| 2002/0131159 | A1 | 9/2002 | Ye et al. |
| 2003/0053196 | A1 | 3/2003 | Lelic et al. |
| 2003/0133092 | A1* | 7/2003 | Rogers ..................... 356/4.01 |
| 2004/0017603 | A1 | 1/2004 | Jay et al. |
| 2004/0036957 | A1 | 2/2004 | Galvanauskas et al. |

FOREIGN PATENT DOCUMENTS

| | | |
|---|---|---|
| EP | 1 427 118 A | 6/2004 |
| GB | A-2401738 | 11/2004 |
| WO | WO 98/30881 | 7/1998 |

OTHER PUBLICATIONS

Spot Size Expander Using UV-Trimming of Trilayer Photosensitive Fibres; Ruth A. Jarvis & John D. Love.

Experimental Investigation of the Beam Spot Size Radius in Single-Mode Fibre Tapers; R. Keil; Electronics Letters Jul. 19, 1984; vol. 20 No. 15.

High-energy and high-peak-power nanosecond pulse generation with beam quality control in 200-μm core highly multimode Yb-doped fiber amplifiers; Ming-Yuan Cheng; Yu-Chung Chang, and Almantas Galvanauskas; Pri Mamidipudi, Rupak Changkakoti, and Peter Gatchell; vol. 30, No. 4, Feb. 15, 2005; pp. 358-360.

Gain Control in erbium-doped fibre amplifiers by tuning centre wavelength of a fibre Bragg grating constituting resonant cavity; Seong Yun Ko, Myong Wook Kim, Dong Hwan Kim, Sang Hyuck Kim, Jae Cheol Jo and Jung Ho Park; May 14, 1998 vol. 34 No. 10.

Modal field transforming fiber between dissimilar waveguides; Kimio Shigihara, Kazuo Shiraishi, and Shojiro Kawakami; J. Appl. Phys. 60 (12), Dec. 15, 1986; pp. 4293-4296.

Beam Expanding Fiber Using Thermal Diffusion of the Dopant; Kazuo Shiraishi, Yoshizo Aizawa and Shojiro Kawakami; Journal of Lightwave Technology, vol. 8, No. 8, Aug. 1990; pp. 1151-1161.

Laser diode-to-fiber launch systems; Aleksandra Jarmolik; ; 1999 Urban & Fischer Verlag; pp. 37-43.

Tapers in Single-Mode Optical Fibre by Controlled Core Diffusion; J.S. Harper, et al.; Electronics Letters Feb. 18, 1988; vol. 24 No. 4; pp. 245-246.

Carbon dioxide laser fabrication of fused-fiber couplers and tapers; Timothy E. Dimmick, George Kakarantzas, Timothy A. Birks, and Philip St. J. Russell; Nov. 20, 1999/ vol. 38, No. 33/ Applied Optics; pp. 6845-6848.

International Search Report; International Application No. PCT/CH2005/000567; date of Mailing: Feb. 24, 2006.

International Search Report; International Application No. PCT/CH2005/000568; date of Mailing: Feb. 24, 2006.

International Search Report; International Application No. PCT/CH2005/000569; date of Mailing Mar. 9, 2006.

Notification of Transmittal of the International Search Report and the Written Opinion of the International Searching Authority, or the Declaration; International Search Report; International Application No. PCT/CH2005/000570; date of Mailing: Mar. 22, 2006.

Written Opinion of the International Searching Authority; International Application No. PCT/CH2005/000569; International Filing date: Sep. 30, 2005.

* cited by examiner

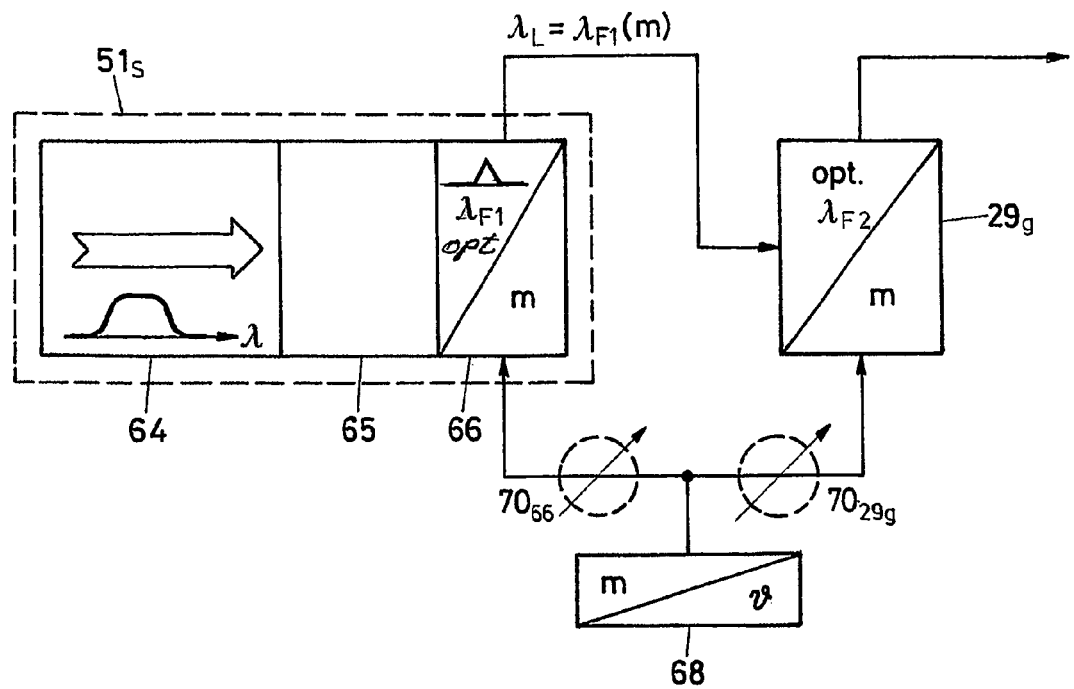
FIG.4
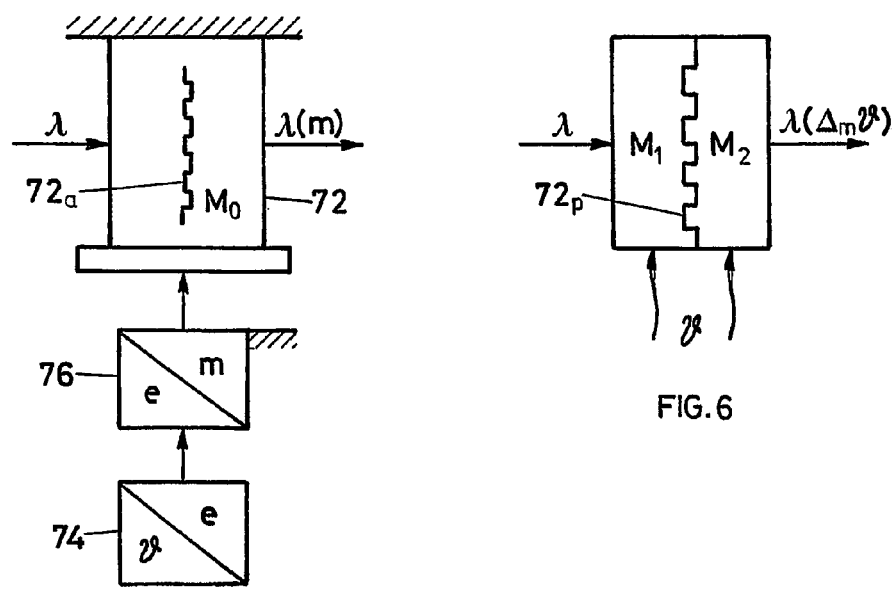
FIG.5
FIG.6

NOT TEMPERATURE STABILIZED PULSED LASER DIODE AND ALL FIBRE POWER AMPLIFIER

RELATED APPLICATIONS

This application is a U.S. national phase application under 35 U.S.C. §371 of international application no. PCT/CH2005/000569 filed Sep. 30, 2005 and claiming priority of European application EP 04029867.1 filed Dec. 16, 2004 and European application EP 05000669.1 filed Jan. 14, 2005.

TECHNICAL FIELD

The present invention departs from the object to construe a laser system which is highly compact and robust to environmental hazards so as to be applicable for portable or even handheld devices. Especially the invention departs from such an object to be resolved whereby, additionally the requirement of low power consumption should possibly be fulfilled so as to allow the respective laser system to be integrated into portable or even handheld laser range finder devices or target designators devices e.g. incorporated in observation instruments. Thereby and in addition to the addressed requirements with respect to compactness and robustness, and additionally to low power consumption, such laser systems as for long distance range finding and target designation should be of relatively high power and should allow accurate evaluation of target reflected laser light.

In spite of the fact that the laser system according to the present invention has been developed with an eye on such applications i.e. for measuring distances and/or radial velocity of cooperative or non-cooperative targets by laser detection and ranging by portable or handheld applications the laser system according to the present invention is suited for all applications where the addressed primary requirements of compactness and robustness are imperative.

BACKGROUND AND SUMMARY

Attention is drawn to the U.S. Pat. No. 3,610,755, U.S. Pat. No. 5,319,434.

To resolve the above mentioned object there is proposed a laser system which comprises a laser light source as well as an output/input coupler unit. Latter comprises a circulator with an input, with an output and with an output/input. Further there is provided a detector unit which has an input. The input of the circulator is operationally connected to an output of the laser light source whereas the output of the circulator is operationally connected to the input of the detector unit. The output/input of the circulator is operationally connected to transmitter and receiver optics. The addressed input, output and output/input of the circulator are optical fibres.

Thereby in one embodiment the transmitter and receiver optics are in one embodiment joined to a single laser output/input port.

Due to the fact that all the input, output and output/input to or from the circulator unit are conceived by optical fibre and downstream the addressed circulator, output and input laser light is guided in one common optical fibre, the addressed laser system is highly compact. Especially providing the output/input optical fibre allows to flexibly locate respective output/input laser optics, separate or as a common port, optimized with respect to space consumption at a respective device equipped with the laser system.

In one embodiment the laser system comprises a master-oscillator/power-amplifier laser arrangement.

In a further embodiment which clearly may be combined with the just addressed embodiment which comprises a master-oscillator/power-amplifier, the laser light source comprises a laser diode.

Thereby a further improvement with respect to compactness is achieved and, additionally, the possibility to generate relatively high power laser light.

In a further embodiment the laser light source is a pulsed laser light source. Thereby and with an eye on the output/input coupler unit as addressed above the overall laser system becomes most suited for distance measuring based on mutual evaluation of transmitted laser pulses and of received laser pulses.

In a further embodiment the laser system according to the present invention comprises an active optical fibre power-amplifier which has an input and an output. The input of such active optical fibre power-amplifier is operationally connected to the output of the laser light source whereas the output of the active optical fibre power-amplifier is operationally connected to the input of the circulator. By providing and construing the addressed amplifier by active optical fibre, on one hand relatively high power laser light is generated and on the other hand the requirement of constructional compactness is maintained.

In a further embodiment the just addressed active optical fibre power-amplifier is pumped.

Still in a further embodiment wherein the laser light source is pulsed the laser system additionally comprises an evaluation unit with an input which is operationally connected to an output of the detector unit. The evaluation unit performs evaluation on multiple laser pulses as detected. Thereby the evaluation accuracy is significantly improved as e.g. with respect to range measurement.

Still in a further embodiment the addressed active fibre power-amplifier is pumped by a pumping diode which further increases constructional compactness and positively affects power consumption of the overall laser system.

Still in a further embodiment the active fibre power-amplifier is gain-modulated.

Gain modulation of the addressed amplifier allows to cope with disturbing influences upon the laser system downstream the addressed amplifier which affect specific characteristics of laser light upstream the addressed amplifier. Instead of selectively remedying on the spot such disturbing entities downstream the amplifier, the addressed gain modulation generically allows to compensate for the respective negative impact on the characteristic of output laser light. In a further embodiment the active fibre power-amplifier is pumped and is gain-modulated by at least one of intensity of pumping light, spectrum of pumping light, pumping pulse width of pumping light, length of active fibre, spectral shift of an optical filter characteristic.

In a further embodiment which comprises on one hand the active fibre power-amplifier which is pumped by pulsing, and, on the other hand the addressed laser light source which generates pulsed laser light, pulsing of amplifier pumping is time-synchronized with the pulsed laser light. Thereby at the addressed pumping, additionally to a synchronized pumping component there may be provided a pumping component which is not synchronized but which provides for a possibly time-varying pumping signal bias.

In a further embodiment the addressed gain modulated active fibre amplifier acts as an adjusting member in a negative feedback control loop whereat a characteristic i.e. a physical entity as e.g. intensity or signal-to-noise ratio is senses in the output laser light as a measured value. This value to be controlled is compared with a desired value or with a desired time course of such value and the gain of the active fibre power-amplifier is adjusted in dependency of the result of such comparing.

Thereby and as was already addressed such a negative feedback control loop allows to achieve and to maintain a desired physical value or characteristic in the output laser light and to cope with disturbing entities within the laser system.

Because providing an active fibre optical amplifier as was addressed on one hand significantly rises output laser light power but on the other hand may introduce additional noise to the output laser light especially by amplified spontaneous emission ASE, in a further embodiment there is provided downstream the addressed amplifier an optical fibre filter which has a filter characteristic the spectral position of which being controllably shiftable.

Normally such optical fibre filter is selected to be a narrow pass-band filter which operates either in pass-band transmission or pass-band reflection. On one hand by such filter being construed as an optical fibre filter, the overall compactness of the laser system is substantially maintained. On the other hand by providing such filter the signal-to-noise ratio of laser light downstream the filter is improved. Additionally providing such filter with a filter characteristic which is shiftable with respect to spectral location, a possibility is introduced to cope with disturbing effects on the output laser light. If e.g. the spectral location of the spectral band of laser light as generated shifts e.g. due to aging or varying temperature, then provision of a spectrally fixed filter characteristic would lead to variation of the overall amplification. By controllably shifting the spectral position of the addressed filter characteristic so as to be matched with the shift of the addressed spectral band, the shift of the spectral band of the generated laser light may not affect the overall amplification. Without such a shiftable filter characteristic or, as was addressed, gain modulation, it would, as an example, be necessary to stabilize the temperature at the laser source by cooling or by means of a temperature negative feedback control loop. Such measures would substantially increase constructional efforts and space for the overall system as well as power consumption.

It is perfectly clear that the principal of providing a controllably shiftable filter characteristic may also be applied to the laser system according to the present invention without having an active fibre power-amplifier.

In a further embodiment the just addressed filter characteristic is shiftable with respect to its spectral location in dependency of a temperature. Thereby it becomes possible to cope with undesired variation of overall amplification which are e.g. due to spectral shift of the spectral band of laser light caused by variation of temperature. As the source which is most affected by temperature variation is the laser light source whereat a varying temperature leads to a spectral shift of the spectral range of laser light, in one embodiment the addressed temperature is selected to be dependent from a temperature of the laser source.

In a further embodiment with the addressed active fibre power-amplifier, there is provided a stabilizing optical fibre filter in the laser light source and a downstream optical fibre filter downstream the amplifier. Please return to the definition of a stabilizing filter. The stabilizing filter and the downstream filter are normally narrow pass-band filters. The filter characteristics of both these filters are controllably shiftable with respect to their spectral position whereby these spectral shifts are matched. Thereby the spectral location of the spectral band of laser light towards the amplifier is governed by the stabilizing filter characteristic and its spectral location whereas noise reduction especially of ASE is performed by the downstream filter. By matching the spectral positions of both filter characteristics e.g. again dependent on temperature, substantially no variation of overall amplification due to shifting of the spectral band of the laser light as generated is present.

In a further embodiment of the laser system according to the present invention all the fibres namely of the input, the output and the output/input of the addressed circulator are standard single-mode fibres at a wavelength of laser light from the laser light source.

In a further embodiment making use of the addressed standard single-mode fibres the transmitter and the receiver optics have the same apertures. Still in a further embodiment departing from making use of standard single-mode fibres, laser light from the laser source is guided in the core of the fibres at the input and at the output/input of the circulator and received laser light is guided in the core as well as in the cladding of fibres at the addressed output/input of the circulator and at the output of the circulator.

Thereby in a further embodiment the numerical apertures of the transmitter optics and of the receiver optics are selected different.

Still in a further embodiment the addressed fibres at the input, output and output/input of the circulator are multi-mode fibres.

Still in a further embodiment the addressed fibres at the input, output and output/input of the circulator are polarization maintaining fibres whereby the laser source generates polarized laser light.

In a further embodiment at least one of the addressed fibres at input, output and output/input of the circulator is of one of the following types: photonic crystal fibre, single-clad fibre, double-clad fibre.

Still in a further embodiment the addressed circulator is an un-polarizing circulator.

Still in a further embodiment at least one of the addressed fibres at the input, output and output/input of the circulator is fusion spliced to a respective fibre of the circulator.

Still in another embodiment laser light throughout the laser system is substantially exclusively guided in optical fibres.

In a further embodiment one end of the output/input fibre is operationally connected to a transmitter optic and to a receiver optic. In one embodiment these optics are formed by one bi-functional optic, in another embodiment as two separate units.

Thereby in one embodiment the addressed end determines the divergence of a laser beam transmitted by the transmitter optic. Thereby considerable saving of lenses is achieved which clearly reduce costs, improves compactness and robustness.

Under a further aspect of the invention a device with a laser system which accords with the laser system as was addressed is portable. Thereby such device in one embodiment is even handheld. In a further embodiment such device incorporates the addressed laser system in a range finder- or target designator unit. Dependent on system power the operating range is up to at least 1 km but up to at least 10 km for higher power systems.

Under a further aspect of the present invention there is proposed a method for producing a laser beam out of a transmitter optic which method comprises generating laser light in an optical fibre having an end coupled to the transmitter optic and further determining the divergence of the laser beam by the conception of the addressed fibre end.

With respect to possible conception techniques we refer to the detailed description.

Still under a further aspect of the present invention there is proposed a handheld device with a laser system which is a part of a laser range finder or target designator and which operates in the addressed ranges.

Attention is drawn on the fact that the content of the European application no. 05 000 669.1 dated Jan. 14, 2005 as well as the content of the European application no. 04 029 867.1 dated Dec. 16, 2004 upon which the present application resides with respect to priority, is considered as a part integrated by reference to the present disclosure.

The inventions under all their aspects and combinations shall now be exemplified by means of the following figures.

BRIEF DESCRIPTION OF THE DRAWINGS

FIG. 4 in a simplified schematic representation, controlled spectral shifting of the stabilized laser wavelength and of the spectral position of a downstream filter characteristic;

FIG. 5 simplified and schematically, "active" shifting of a filter characteristic;

FIG. 6 in a representation in analogy to that of FIG. 5 "passive" spectral shifting of a filter characteristic;

DETAILED DESCRIPTION

The present invention will first be described by means of a today's realized embodiment. This under the title of "1. Today's realized embodiment".

As in this embodiment, various features are considered per se inventive and may be realized in different variants, may further be combined with other laser systems different from the today's realized embodiment, subsequent to the description of today's realized embodiment, those specific features possibly with their variants, their applicability to laser systems different from the today's realized will be addressed under separate titles namely under "2. Temperature shift matching", "3. Modulatable Amplifier", "4. Bi-directional coupler".

1. Today's Realized Embodiment

Figure 1:
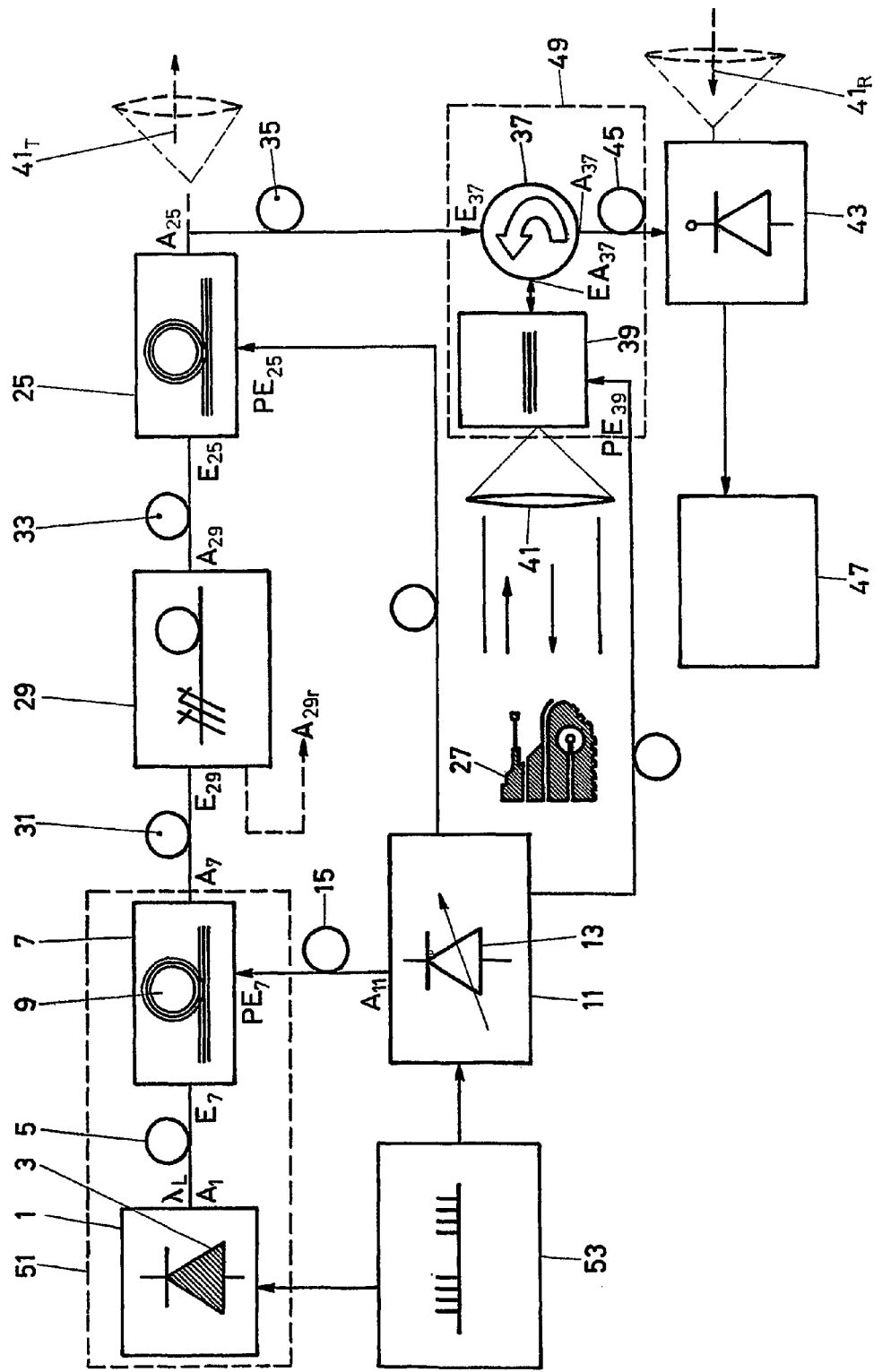
FIG. 1 a signal-flow/functional-block diagram of an all-fibre laser system as realized today for portable range finder- or target designator-applications.

The today's embodiment as shown in FIG. 1 is a laser range finder for cooperative or non-cooperative targets or applied as a laser target designator. The laser system as shown is of a size, construction and power consumption which allows integration into a handheld device and is fully autonome. It may also be applied for other fields of applications where similar requirements are valid with respect to size or compactness, power consumption and robustness.

A master laser unit 1 comprises a single mode DFB (distributed feedback) laser diode 3 emitting light pulses of a wavelength within a predetermined bandwidth. The spectral temperature drift of the wavelength of emitted laser light of such DFB diode is typically of the order of 0.1 nm/K and below. Such a DFB laser diode is e.g. a diode of Series FOL 15DCWD as available from Fitel, Furukawa Inc.

The light emitted from the DFB diode 3 is coupled from an output $A_1$ of the master laser unit 1, possibly via an optical fibre 5, to the input $E_7$ of a first amplifier stage 7. The length of the optical fibre 5 is primarily selected according to the mutual positioning of the unit 1 and unit 7 and is omitted for optimum packaging density and for minimum optical loss from output $A_1$ to input $E_7$.

The first amplifier stage 7 comprises, as an actively amplifying element, an active fibre 9 which is optically pumped by light input at pumping input $PE_7$. Thus the output laser light of the master laser unit 1 is coupled into and amplified by the active fibre 9.

The active fibre is an Er/Yb co-doped fibre having a gain spectral band between 915 nm and 1500 nm. More generically the active fibre is doped with metallic ions as e.g. ions of Erbium and/or of Ytterbium and/or of Neodymium and/or of Praesodymium and/or of Chromium. The spectral band of light output at $A_1$—is within the gain band of amplifier stage 7.

The pumping light energy input to input $PE_7$ is generated at an output $A_{11}$ of a pumping unit 11 comprising a pumping diode 13. Diode 13 is a Fabry-Pérot Pump-Laser diode having a typical temperature dependency of the emission wavelength of 0.3 nm/K and having its 20° C. centre wavelength at about 945 nm. Such a diode is e.g. a diode QOFP-975-3 from QPhotonics, LLC.

Thus by selecting the centre wavelength of the pumping diode 13, at about a centre temperature of a temperature range expected at the pumping diode 13, within the gain spectrum band of the first and, as will be described later, of a second and possibly a third amplifier, and the expected temperature shift of that centre wavelength covered by the gain absorption spectral bands of the amplifier stages, no temperature stabilization of the pump laser diode 13 is necessary. Thereby a first substantial saving of constructional space and of electric power is already achieved.

Depending on intended constructional positioning of pumping unit 11 and first amplifier stage 9 an optical fibre 15 is interconnected between output $A_{11}$ and input $PE_7$.

Due to the high gain G of the first fibre amplifier stage 7 there is present at its output $A_7$ optical noise especially due to amplified spontaneous emission ASE, that is emitted in a broad spectral band and which increases with the gain value of the amplifier stage 7. Amplified spontaneous emission ASE results in broadband light emission out of the first high gain amplifier stage 7 independent from and superimposed on the amplified laser light wavelength $\lambda_L$.

Because the energy of the ASE has to be taken into account for qualification into certain laser safety classes, and, in addition, adds to the noise level of the output light at $\lambda_L$ and finally at and from an illuminated target, a fibre-optical ASE filter unit 29 with input $E_{29}$ and output $A_{29}$ is coupled, possibly via an optical fibre 31, to the output $A_7$ of the first amplifier stage 7. The ASE filter unit 29 is a fibre narrow band-pass filter. The central pass wavelength $\lambda_F$ of ASE filter unit 29 accords with the wavelength $\lambda_L$ of laser light generated by the master laser 1. To prevent the narrow pass-band of the ASE filter unit 29 and thus $\lambda_F$ and the wavelength $\lambda_L$ of laser light to become offset due to temperature variations at the laser source 51 and/or the ASE filter unit 29, a temperature shift matching is established as will be discussed also under a more generic aspect in "2. Temperature shift matching".

By such shift matching it is achieved that $\lambda_F$ shifts spectrally substantially equally as does $\lambda_L$.

Thereby, no cooling or temperature control is to be provided at the laser source 51 which leads to a second substantial saving of constructional space and power consumption.

In FIG. 1 the ASE filter unit 29 although represented rather to operate in transmissive band-pass mode may also be conceived to operate in reflective band-pass mode as schematically shown by dash line at the filter output $A_{29r}$.

The output $A_{29}$ (or $A_{29r}$) of fibre ASE filter unit 29 is coupled, possibly via an optical fibre 33, to an input $E_{25}$ of a second fibre-optical amplifier stage 25, which is conceived at least similar to the first fibre amplifier stage 7 and which has an output $A_{25}$ and is pumped at an input $PE_{25}$. The output $A_{25}$ is coupled via an optical fibre 35 to the input $E_{37}$ of a fibre based circulator 37, as e.g. available from JDS Uniphase as polarization-intensive fiber optic circulator.

The circulator 37 has an input/output $EA_{37}$. According to the arrow direction shown, light input at $E_{37}$ is output at $EA_{37}$ and isolated from an output $A_{37}$. Light input at $EA_{37}$ is isolated from $E_{37}$ and output at $A_{37}$. The $EA_{37}$ is coupled via an optical fibre 39 to the transceiver optics 41. Output $A_{37}$ is coupled to a detector unit 43 via optical fibre 45. In the detector unit 43 optical to electrical conversion is performed and the respective electric signals are fed to an evaluation unit 47 which generates the desired result information as e.g. target distance, target speed, target trajectory etc.

In spite of the fact, that fibre 39 as shown may be realized as a third fibre amplifier stage pumped at $PE_{39}$, in the today's realized embodiment it is a "passive" optical fibre.

By the fibre based circulator 37 and the optical fibres 35, 39 and 45 there is realized a fibre output/input coupler unit 49 comprising the circulator device 37 for polarised or unpolarized laser light.

Thereby fibre 45 and 39 are of few-mode type. Fibre 35 is optimized with respect to the laser source up to $A_{25}$ e.g. with respect to laser light intensity.

As fibre 39 is selected short i.e. up to at most 10 cm and is not bended, coupling from the fundamental to higher order modes in that fibre is neglectable. Because manufacturers of commercially available circulating devices as of 37 do impose fibre parameters, fusion splicing of the fibres 35, 39 and 45 to the fibres of the device 37 is performed to minimize losses. For such fusion splicing we refer to Electron. Let. Vol. 22 No. 6; pp. 318, 1986; "Low-loss joints between dissimilar fibres by tapering fusion splices".

The connector at the end of fibre 39 towards the transceiver optics 41 adapts the mode field diameter MFD to the transceiver optics 41 acting as emitter and receiver optics and determines the divergence of the emitted light beam. The coupler unit 49 with transceiver optics 41 is considered per se inventive and is more generically addressed in "4. Bi-directional coupler."

If there is provided, separately, a transmitter optic $41_T$ as shown in dash line and a receiver optic $41_R$ also shown in dash line, obviously the circulator 37 is omitted. Then the end of that fibre, as of active fibre from amplifier stage 25 adapts the MFD to the optic $49_T$ and thereby determines the divergence of the emitted laser beam. By determining this divergence by appropriate conceiving the addressed fibre end, significant structural savings at the respective optics $41_R$, $41_T$ as with respect to lenses are achieved.

If the unit with fibre 39 is to be conceived as an amplifier stage, instead of an active fibre a doped body of glass as e.g. a rod of doped glass may be provided.

In spite of the fact that it might be possible to pump all the amplifier stages 7, 25 and possibly 39 with a single pump diode 13, it has to be understood, that the pumping unit 11 which is shown in FIG. 1 to pump the first 7, second 25 and possibly further fibre amplifier stages comprises the number of decentralized pumping diodes necessary to provide the pumping power as requested. Thus the "one unit" representation as in FIG. 1 has been selected merely for simplifying reasons.

The laser source 51 incorporating master laser unit 1 and at least the first fibre amplifier stage 7 is a fibre Master-Oscillator-Power-Amplifier laser source, a fibre MOPA laser source. Definition:

We understand under "optical fibre", be it "passive" or active as for amplifying purposes, coaxial- as well as strip-waveguides. As it becomes more and more possible to manufacture low-loss waveguides by strip coating plastic material substrates allowing high waveguide package density and flexible mount, we believe that in the rather near future it will become possible to construe the optical fibres also for the present system by this strip-technique.

In the embodiment of FIG. 1, a double stage or possibly triple stage fibre amplifier system is used. Today such systems are limited to single pulse energies of approx. 100 µJ, which is not enough for single pulse laser ranging on non-cooperative targets at distances of several kilometers. Therefore a multi-pulse integrating evaluation method is today used.

Multi-pulse direct range finding or target designating comprises—as known in the art—detection of the time-variant light signal reflected from the target 27 and according to FIG. 1 collimated by the transceiver optics 41 or $41_R$.

The signal is converted into an electronic signal, digitised and stored e.g. in evaluation unit 47. By integrating in the evaluation unit the electric digital signals representing reflected light of multiple pulses the signal-to-noise-ratio is increased.

Various known methods of digital signal processing can be applied to identify the time-of-flight of the laser multi-pulses emitted from the laser system, reflected form the target 27, detected and evaluated by the receiver detector and evaluation units 43 and 47 which methods are not described in the frame of the present inventions under all its aspects.

As may be seen schematically in FIG. 1 the laser diode 3 of master laser unit 1 is controlled by a pulse control unit 53. The pumping diode or diodes 13 of pumping unit 11 are operated in pulsed mode too, whereby under one aspect considered inventive per se, and addressed under "3. Modulatable Amplifier" pulsing of the pumping diode or diodes 13 is synchronised with pulsing of the laser diode 3. Thus there is established a predetermined or adjustable phasing of pulsating control of the pumping diodes 13 with respect to pulsing control of the laser diode 3. Nevertheless such phasing needs further not be equal for respective pumping diode or diodes pumping different fibre amplifier stages and needs not be constant in time.

The synchronisation is phase locked by respective negative feedback phase lock control loops (not shown in FIG. 1).

Pulsating power applied from the pumping diodes 13 to their respective fibre amplifier stages 7, 25, possibly 39 may be said to be a pulse modulation of the gain G of these stages. Parameters of such gain modulation as especially gain value, duty cycle, on/or gain ratio may be adjusted or negative feedback controlled to optimize stability and signal-to-noise ratio of the overall system.

As addressed above the ASE fibre filter unit 29 is conceived so that its pass-band with $\lambda_F$ has substantially the same shift as a function of temperature and in a predetermined temperature range as the wavelength $\lambda_L$ of the laser light emitted from master laser unit 1. This is achieved by "passive" matching fibre ASE filter unit 29 realized as exemplified in FIG. 9 and explained under "2. Temperature shift matching". The master laser unit 1, the fibre ASE filter unit 29 as well as possibly the fibre amplifier stages 7, 25 and possibly 39 are thermally tightly coupled, so that they experience substantially the same temperature variations over time. This simplifies the addressed matching.

In context with FIG. 1 there has been described a fibre MOPA Laser System in context with a non-coherent direct multi-pulse detection method for laser-range finding on cooperative or non-cooperative targets or for target designator purposes by portable or even handheld instruments.

Instruments including the system as has been described with the help of FIG. 1 are compact, show maximum detecting ranges dependent from installed laser power from 1 km far above 10 km distance on non-cooperative end even small sized targets, exhibit low power consumption, provide an emitted laser beam of extremely low divergence—due to fibre-end MFD adaptation—even with short focal length collimators and are easy to integrate into optical systems. Due to the all fibre design, this laser system is rugged or robust without the need of stable construction elements to fix discrete optical components that could misalign during vibration, temperature cycling or temperature shocks. An in-fibre output beam has several advantages for place-independent application. The flexibility of packaging of the components of the fibre MOPA laser system within the housing leads to reduced form factors when integrated into optical systems, like portable observation instruments and surveying instruments, handheld distance meters or ship-, sub-marine-, space craft-, aircraft-land vehicles—based systems as tanks, where available space is limited.

2. Temperature Shift Matching

With the help of FIG. 1 matching of temperature shift of the spectral location of the characteristic of filter unit 29 with temperature shift of laser wavelength $\lambda_L$ was addressed. More generically, a laser source with a downstream optical filter especially having a narrow pass-band characteristic removing unwanted spectral components from the light emitted from the laser source, shall now be considered.

Without providing in the laser source as of 51 of FIG. 1 a temperature stabilization at least for the active laser light generating devices e.g. by high capacity cooling or by negative feedback temperature control, dependent also from the environmental temperature conditions to which the laser source is exposed in operation, the varying temperature leads to a shift of the laser light wavelength $\lambda_L$. The signal-to-noise ratio (S/N) downstream a narrow band-pass filter unit, as of 29 in FIG. 1, increases with diminishing width of the passband of the filter unit at stationary, time invariant conditions. On the other hand the smaller than the pass-band width is selected, the more shifting of the laser light wavelength $\lambda_L$ will lead to reduced S/N. Especially for laser systems whereat compactness, low-power consumption and high S/N are predominant requirements, the necessity of temperature stabilizing the laser source establishes serious problems. This is especially true for substantially all fibre laser sources, especially MOPA laser sources as of 51 of FIG. 1 with downstream filter unit 29 whereat the filter unit 29 is especially provided to reduce ASE noise.

Whenever the temperature shift of the laser light wavelength $\lambda_L$ per se is not of significant harm but the resulting decrease of S/N is, the principal approach according to one aspect of the present invention is not to stabilize the wavelength of the laser light by stabilizing the temperature but to match the temperature dependency of the spectral location of the filter characteristic of the downstream filter with the temperature dependency of the laser light wavelength.

Thereby in a laser system whereat downstream of a laser source there is provided an optical filter, temperature stabilization of the laser wavelength $\lambda_L$ is superfluous and thus omitted.

Figure 2:
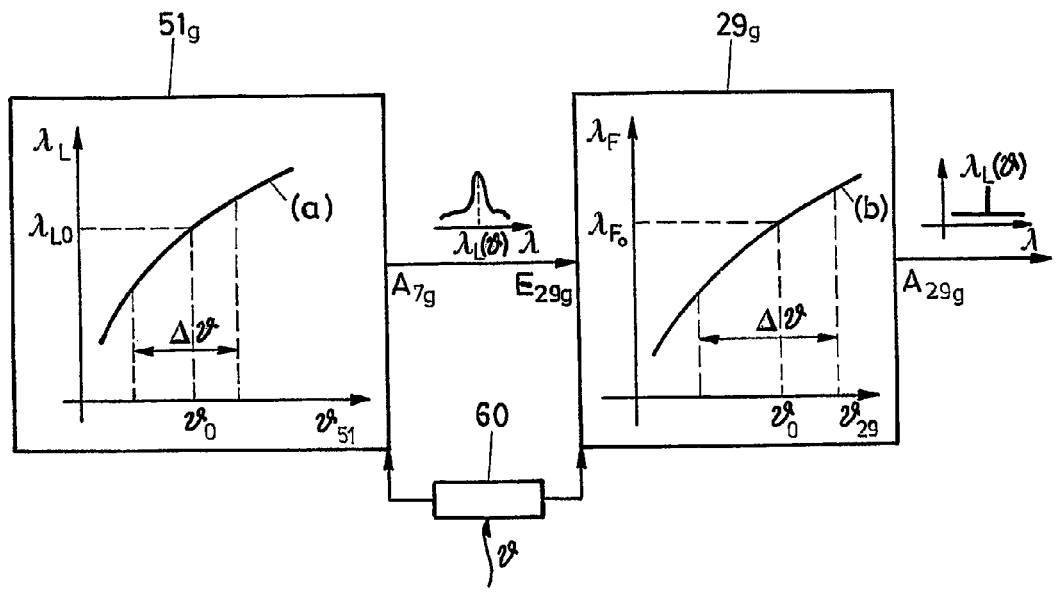
FIG. 2 schematically and simplified the occurrence and result of relative laser wavelength shift relative to a downstream optical filter characteristic.

By means of a functional-block/signal-flow diagram according to FIG. 2 the generic solution according to the one aspect of the present invention shall be described.

The laser source 51$_g$ emits laser light at a wavelength $\lambda_{LO}$ given a temperature $\theta_O$ of the laser source, with an eye on FIG. 1 especially of the laser diode 3. As qualitatively shown within the block representing laser source 51$_g$ the wavelength $\lambda_L$ shifts as a function of temperature $\theta_{51}$ according to a wavelength/temperature characteristic (a).

The laser light emitted at the output $A_{7g}$, as of output $A_7$ of FIG. 1, is operationally connected to the input $E_{29g}$ of filter unit 29$_g$ which has at least one characteristic wavelength $\lambda_F$ of the filter characteristic. This characteristic may, in the most general case, be a low-pass and/or a high-pass or a band-pass characteristic. The filter unit 29$_g$ may act in transmission or reflection with respect to input and output light at output $A_{29g}$.

Generically, the addressed characteristic wavelength $\lambda_F$ of filter unit 29$_g$ characterizes that part of the filter characteristic which is exploited to remove undesired spectral bands from the output light. The filter characteristic may define for more than one characteristic wavelength $\lambda_F$. The filter characteristic defined by the one or more than one characteristic wavelengths $\lambda_F$ may shift as a function of filter temperature $\theta_{29}$ as qualitatively shown in FIG. 2 by characteristic (b).

According to the addressed aspect of the present invention, instead of stabilizing $\theta_{51}$ e.g. on the working point temperature $\theta_O$ at the laser source 51$_g$ and either selecting a filter unit 29$_g$ whereat spectral shift of the filter characteristic as a function of temperature is neglectable or stabilizing the temperature $\theta_{29}$ at the filter unit 29$_g$ as well, as on e.g. $\theta_O$ as shown in FIG. 2, the temperature shift of the characteristic filter wavelengths $\lambda_F$ is tailored to closely match with the temperature shift of the laser light wavelength $\lambda_L$ at least in a predetermined temperature range $\Delta\theta$. This is facilitated by establishing thermally narrow coupling between the laser source 51$_g$ and the filter unit 29$_g$ as represented schematically by coupling 60.

Assuming the laser light output at $A_{7g}$ has a desired wavelength $\lambda_L$ and has noise energy in the spectral ranges adjacent to $\lambda_L$. As $\lambda_L$ shifts with temperature, at the output $A_{29g}$ filtered output light is thus present with a shifted wavelength $\lambda_L$ and with a substantially unaffected S/N. Thereby, a significant reduction of temperature dependency of S/N is achieved. Due to the fact that no temperature stabilization, in the sense of keeping temperature constant, is necessary as e.g. a negative feedback temperature control, the overall arrangement is significantly simplified which leads to improved compactness as well as to reduced power consumption. Also dependent on the intensity of the laser light emitted by the laser source $51_g$ and thereby on thermal loading of the optical filter unit $29_g$ different techniques may be used as known to the skilled artisan to realize an optical filter unit $29_g$ first considered without additional measures for providing the controlled shift of spectral location shift of its characteristic in dependency of temperature.

Such filters may be e.g.
  interference filters comprising a layer system of thin dielectric layers
  optical surface and/or volume gratings
  Bragg gratings
  spectrally selective mirrors
all in transmissive of reflecting operation mode.

All or at least practically all optical filters which may be used for the addressed purpose reside on the geometry of filter structures e.g. on layer thickness, grating width, which are decisive for the characteristic wavelengths of such filters as well as on optical parameters as on index of refraction of materials involved.

Such residing on geometry is exploited according to the present aspect of the invention by generating at the respective filter a mechanical loading which may—in one case—be realized directly by loading the respective filter structure thermally and exploiting material inherent geometric variations as a function of temperature or—in another case—by applying externally a mechanical load generated by on appropriate thermal-to-mechanical conversion, Thereby also taking temperature dependent variation of optical material parameters into account. In fact in both cases there is exploited a thermal-to-mechanical conversion be it by respective thermal behaviour of a material or be it by applying externally a mechanical load as a function of a temperature. Thus under a most generic aspect there is exploited a thermal-to-mechanical conversion.

Figure 3:
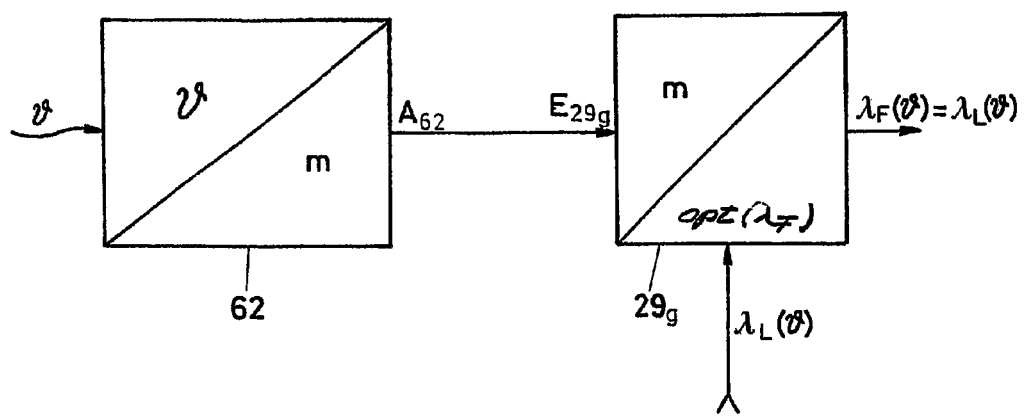
FIG. 3 in a schematic and simplified representation the principle of controlling spectral shift of a filter characteristic matched to laser wavelength shift.

Generically and according to FIG. 3 there is provided a temperature to mechanical converter 62 the mechanical output signal $A_{62}$ being operationally connected to a mechanical input $E_{29g}$ of filter unit $29_g$ which unit acts as a mechanical to optical converter, in that the filter characteristic with $\lambda_F$ is spectrally shifted by the mechanical loading and, resulting therefrom, geometric variation. Thereby the spectral location of the filter characteristic with $\lambda_F$ of the filter unit $29_g$ in dependency of input temperature $\theta$ is matched with the temperature dependency of laser wavelength $\lambda_L$.

According to the embodiment of FIG. 3, the combined temperature to mechanical and mechanical to optical conversion has to be matched with the temperature dependency of the wavelength $\lambda_L$ of the laser source 62.

If the laser source, as of laser source 51 of FIG. 1, comprises an active laser device, as of the laser diode 3, which emits light in a broader spectral band as e.g. a Fabry-Pérot diode it is customary to stabilize the laser source output by loading the lasering device with an optical resonator. Such a resonator may be optically delimited by an optical filter acting as a narrow-band reflective filter. The center wavelength of the filter-structure pass-band substantially defines for the wavelength at which the lasering device operates and is thus stabilized.

Definition:

We call a filter structure as a part of an optical resonator which loads an active laser device, and which filter structure operates as a narrow-pass-band reflective filter, the center wavelength thereof stabilizing the addressed device to operate in a narrow wavelength-band, ideally on a laser-wavelength, a stabilizing filter. In this case one possibility of realizing substantially equal temperature shifts of the emitted laser light wavelength $\lambda_L$ and of the filter characteristic with wavelength $\lambda_F$ of the downstream filter unit is to establish for substantially equal spectral temperature shifts of the stabilizing filter and of the downstream filter. This is shown in FIG. 4 schematically.

According to FIG. 4 the active lasering device 64, in the specific embodiment of FIG. 1 laser diode 3, emits in its operation light in a relatively broad spectral band $B_{64}$. A stabilizing oscillator 65 with stabilizing filter 66 has a resonance wavelength substantially determined by the central wavelength $\lambda_{F1}$ of the pass-band of stabilizing filter 66. The stabilizing filter 66 is conceived as a mechanical to optical converter. A mechanical load, as a sharing-, compressing-, pulling- or moving-action, applied thereon, results in a spectral shift of the center wavelength $\lambda_{F1}$. Thus in dependency of a mechanical signal m applied to the stabilizing filter 66 the wavelength $\lambda_L$ on which the device 64 is stabilized is varied.

Especially due to additional optical stages as of amplifier stages according to amplifier stage 7 of FIG. 1, at the output of stabilized laser source $51_S$ the emitted light comprises also energy at wavelength different from $\lambda_L = \lambda_{F1}$ (m) which is considered as noise.

There it is provided, in analogy to FIG. 3, a filter unit $29_g$ simultaneously acting as a mechanical to optical converter. The spectral location of the filter characteristic of unit $29_g$, specified by one or more than one characteristic wavelengths $\lambda_F$, is controllably shifted in dependency of an applied mechanical load signal. In the case of a narrow pass-band characteristic of filter unit $29_g$, the pass-band central wavelength $\lambda_{F2}$ is selected equal to $\lambda_{F1}$ of stabilizing filter 66. The spectral shifts of $\lambda_{F1}$ and of $\lambda_{F2}$ respectively in dependency of input mechanical load signals m is tailored to be as equal as possible.

If the stabilizing filter 66 and the filter $29_g$ are equal and a temperature to mechanical converter 68 provides to both filters 66 and $29_g$ the same mechanical load signal m, then the temperature shift of $\lambda_{F2}$ and of $\lambda_{F1}$ will be substantially equal. As $\lambda_{F1}$ governs the laser light wavelength $\lambda_L$, the temperature $\theta$ does not affect the gain of laser light in spite of the varying wavelength $\lambda_L(\theta)$ as would be caused by a shift of $\lambda_L$ with respect to the characteristic filter wavelength $\lambda_{F2}$.

It is not necessary that the two filters 66 and $29_g$ have the same mechanical to optical conversion characteristic. If these characteristics are different, and as schematically shown in FIG. 4 by respective weighting units $70_{66}$ and $70_{29g}$, the different characteristics are taken into account by applying for the same temperature $\theta$ different mechanical loadings to the filters 66 and $29_g$.

In the embodiment according to FIG. 3 the overall conversion characteristic of temperature $\theta$ to spectral shift of the filter characteristic with $\lambda_F$ is to be matched with the spectral temperature shift of the laser wavelength $\lambda_L$. In the embodiment according to FIG. 4, this is achieved by matching the downstream filter $29_g$ with the stabilizing filter 66. In both embodiments as of FIG. 3 and of FIG. 4 we have discussed controlled temperature dependent shift of the spectral location of the filter characteristic of one or more than one optical filters so as to avoid the wavelength of laser light becoming offset from a desired spectral filter band.

As was already addressed, two approaches are to be considered with respect to mechanical control of optical filter characteristics. In a first approach that we call "active" the optical filter is subjected to a mechanical load signal as e.g. to a force which is generated in dependency of temperature by an external converter. A second possibility is to exploit mechanical and/or optical characteristics e.g. index of refraction, which vary in dependency of temperature at the optical filter itself. Such material characteristics may be thermal expansion, compression, bending index of refraction etc. The filter characteristic is then controlled by the geometric and material layout and the thermical/mechanical and thermical/optical characteristics of material which governs the filter characteristic in dependency of temperature. We call this approach the "passive" approach.

The "active" and the "passive" approaches for realizing temperature control of filter units as of unit $29_g$ and/or stabilizing filter 66 of FIGS. 3 and 4 and, with an eye on FIG. 1, of filter unit 29, are schematically shown respectively in the FIGS. 5 and 6. According to FIG. 5 a filter unit 72 as has been addressed is realized e.g. by grating $72_a$ e.g. applied within the volume of material $M_O$. An external drive unit comprises a temperature to electric converter 74 e.g. a temperature probe. The output of converter 74 acts on an electrical to mechanical converter unit 76 as e.g. on a Piezo-material device. The electrical to mechanical converter unit 76 acts as e.g. by pressure on the filter unit 72 with the grating $72_a$. Thereby the grating $72_a$ is mechanically deformed which results in a spectral shift of the transmitted or reflected spectrum with wavelength $\lambda(m)$.

In the "passive" embodiment as schematically shown in FIG. 6 the grating $72_p$ is realized in the interface between two different materials $M_1$ and $M_2$ or possibly within the volume of single material. Due to temperature dependent geometric and optical variation of the one material or of the different materials, the spectral location of the filter characteristic is shifted. Thus in the "passive" embodiment as schematically exemplified in FIG. 6 the material structure of the filter element per se acts as a temperature to mechanical converter as of 62, 68 of the FIG. 3 or 4 and, additionally, as a mechanical to optical converter and, with respect to optical material characteristics as thermical to optical converter.

Figure 7:
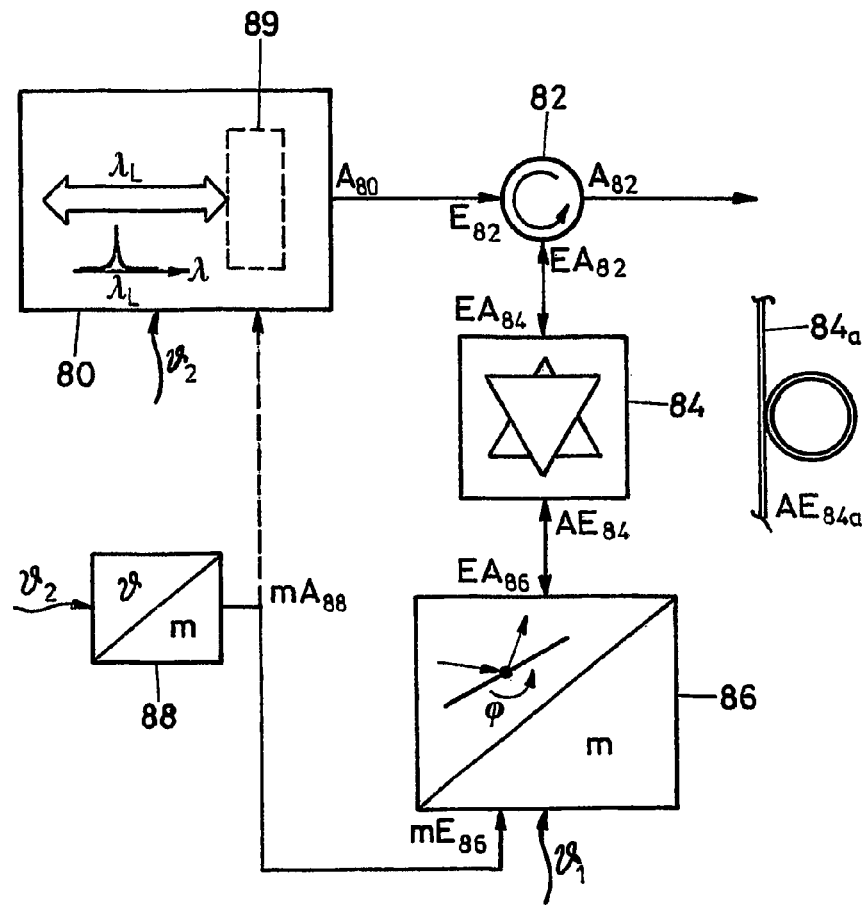
FIG. 7 by means of a simplified signal-flow/functional-block diagram a laser system with matched laser wavelength and filter characteristic both shifting as a function of temperature.

In FIG. 7 there is schematically shown by means of a signal-flow/functional-block diagram one realization form of the embodiments as have been principally explained with help of FIGS. 2 to 6.

The output $A_{80}$ of a laser source 80 is operationally connected to input $E_{82}$ of circulator 82. The input/output $EA_{82}$ of circulator 82 is fed to input/output EA 84 of bi-directional optical amplifier unit 84. The output/input $AE_{84}$ of amplifier unit 84 is operationally connected to input/output $EA_{86}$ of a narrow-band reflecting unit 86. The reflected spectral band of unit 86 is controllably shiftable via mechanical load input signal $mE_{86}$. A temperature to mechanical converter unit 88 has a mechanical output $mA_{88}$ which is operationally connected to the mechanical input $mE_{86}$ of narrow band reflecting unit 86. As evident to the skilled artisan laser light at $A_{80}$ is led via circulator 82 and amplifier unit 84 onto the narrow band reflecting unit 86 and is there reflected. The reflected light is fed via amplifier unit 84 and $EA_{82}$ of circulator 82 to the output $A_{82}$. Temperature $\theta_2$ of laser source 80 is sensed by temperature to mechanical converter 88, resulting in shifting the spectral position of the narrow-band reflected spectrum of the reflecting unit 86. Thereby the spectral position of the filter characteristic reflecting unit 86 is matched to the temperature shift of laser light wavelength $\lambda_L$.

This embodiment described up to now accords with the embodiment as was described with the help of FIG. 3, thereby exploiting "active" matching according to FIG. 5.

As shown in dash lines in a further embodiment there may be provided a stabilizing filter 89 according to stabilizing filter 66 of FIG. 4 so that the filter characteristic of unit 86 is spectrally shifted matched with the spectral shift of laser wavelength $\lambda_L$ transmitted due to the stabilizing filter 89.

Both embodiments i.e. with or without stabilizing filter 89 may thereby also be realized in "passive" form. This according to FIG. 6 and as shown in FIG. 7 by temperature $\theta_1$, directly affecting unit 86 and its geometric and/or optical parameters decisive for the spectral location of filter characteristic at unit 86. The same "passive" technique may be applied to stabilizing filter 89. In one embodiment the stabilizing filter 89 is conceived at least similar to the narrow band reflecting unit 86 as of same type and material so as to facilitate spectral shift matching. As further schematically shown in FIG. 7 by the mechanical signal m e.g. the tilting angle $\phi$ of a mirroring surface may controllable be varied, "passively" or "actively", thereby varying controllably the spectral location of the reflected pass-band.

In certain cases and with applying a stabilizing filter 89, mixed type realization may be adequate e.g. "active" operation of stabilizing filter 89 and "passive" operation of filter unit 86 or vice-versa.

As we have already addressed, matching the spectral positions of filter characteristics of filter units downstream the laser source with the laser wavelength shift, in dependency of temperature, is especially suited for highly compact, low-power laser systems. Such a laser system is especially one which is at least in a substantial part conceived in optical fibre technique. Thereby and as shown in FIG. 7 e.g. the amplifier unit 84 may be realized by an "active" optical fibre $84_a$ whereby in such case the narrow band reflecting unit 86 is advantageously realized in optical fibre technology, too.

Several possibilities for realizing a reflecting unit $84a$ exist:

An optical filter unit consisting of thin layers of dielectric materials and operating as an interference reflecting device. The layers are applied e.g. by gluing or coating on the end $AE_{84a}$ of the "active" optical fibre $84_a$ or are provided in a separate optical element which is butt-coupled or coupled via a separate coupling device to the addressed fibre end. The dielectric coatings are conceived to result in a spectral shift of the reflected narrow-band spectrum when mechanically stressed or when directly thermically loaded.

A further possibility is to provide surface and/or volume gratings as e.g. spatially periodic structures at the/or adjacent to the end $AE_{84a}$ of the "active" optical fibre 84a. Here too the gratings are conceived e.g. so as to be geometrically varied by mechanical stress applied thereto being "actively" or "passively" as was explained.

A further possibility is to apply fibre Bragg gratings, uniform apodized or chirped or coated fibre Bragg gratings, fibre Bragg gratings in different fibre compositions or structures such as e.g. on polymer fibres, germanosilicate fibres or photonic crystal fibres. Here too geometric variations and/or variations optical parameters of material provide for spectral shift of the filter characteristics.

Laser systems which are temperature matched as describe and realized in fibre technique—at least in part—are highly suited for handheld or at least portable systems, for systems where space, power consumption and robustness are predominant requirements. Such systems may e.g. be submarines, ships, spacecrafts, aircrafts, landvehicles as tanks. A laser system especially suited for such applications was described in context with FIG. 1.

Figure 8:
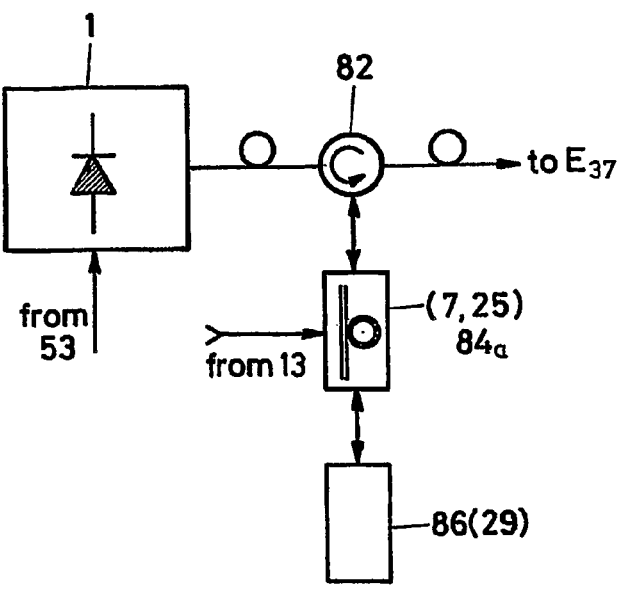
FIG. 8 the matching technique according to FIG. 7 applied to a laser system according to FIG. 1.

FIG. 8 shows a part of the system of FIG. 1 which is realized according to FIG. 7 in fibre technique. The same reference numbers are used for elements which have already been described to facilitate understanding. The output of laser diode 1 of FIG. 1 is operationally connected to circulator 82 of FIG. 7. The amplifier stages 7 and 25 of FIG. 1 are realized by the pumped bi-directional fibre amplifier stage 84a as of FIG. 7 and the ASE filter unit 29 is realized by a narrow band reflecting fibre unit 86 as has been explained in context with FIG. 7. The output of circulator 82, with an eye on FIG. 1, may directly operationally be connected to the input $E_{37}$ of circulator 37. Amplifier stage 7, ASE filter 29 and second amplifier stage 25 as of FIG. 1 are realized by the fibre bi-directional, pumped amplifier stage $84_a$ and the fibre narrow band reflecting unit 86. Clearly for temperature matching all the possibilities which have already been addressed as of "passive" control, "active" control, additional provision of a stabilizing filter as of 89 of FIG. 7 may be applied also in the embodiment of FIG. 8.

The embodiment of FIG. 8 is a double-pass MOPA laser system configuration with a narrow band ASE filter which is matched with the master laser as concerns temperature shift of laser wavelength and spectral location of the pass-band of the ASE filter.

The narrow band reflecting unit 86 of FIG. 7 and according the ASE filter unit 29 of FIG. 8 may e.g. be realized as was addressed in context with FIG. 7.

Figure 9:
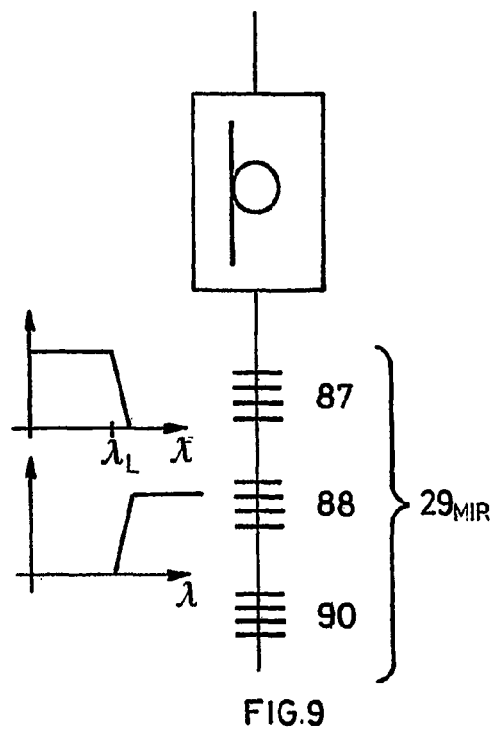
FIG. 9 a controllably spectrally shiftable pass-band optical filter in a simplified and schematic representation as applicable in the embodiment of FIG. 8.

In FIG. 9 there is schematically exemplified one realization form of unit 86 especially to be linked to an upstream optical fibre as to the active fibre amplifier 84a of FIG. 8. Unit 86 comprises a low-pass grating filter stage 87 followed by a high-pass grating filter stage 88, at a reference temperature $\theta_O$, both with corner wavelengths at about $\lambda_L$ of the laser light. A fibre Bragg grating 90 acts as reflecting element. Mechanical control especially of the corner wavelengths of the stages 87 and 88 is e.g. performed by "active" compression or, "passively", by providing the respective grating in a material which has a desired volume versus temperature shrinking characteristic. With an eye on FIG. 7 it is evident that the stabilizing filter 90 may be provided with grating filter stages similar to the stages 87 and 88 to provide for matched shift of laser wavelength $\lambda_L$ and filter pass-band.

The laser system as has been exemplified in the FIGS. 7, 8 and 9 are operating with reflective filter units 86.

Figure 10:
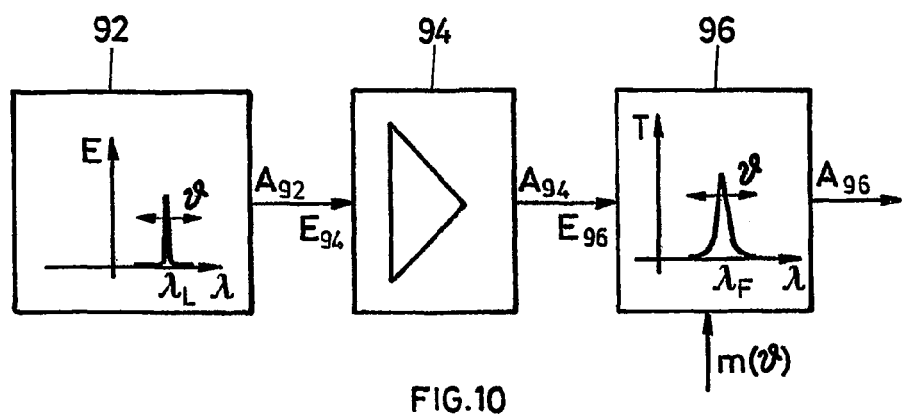
FIG. 10 a simplified signal-flow/functional-block representation of a laser system with a transmission filter.

In analogy to FIG. 7, FIG. 10 exemplifies schematically a laser system whereat the narrow pass-band filter unit operates as a transmissive unit.

According to FIG. 10 the output $A_{92}$ of laser source 92 is operationally connected to the input $E_{94}$ of an optical amplifier unit 94. The output $A_{94}$ is operationally connected to the input $E_{96}$ of a narrow pass-band filter unit 96. The wavelength $\lambda_L$ of the laser source 92 shifts with temperature $\theta$ as shown in block 92. The filter characteristic with the centre wavelength $\lambda_F$ of the narrow pass-band filter unit 96 is shifted in dependency of temperature $\theta$ substantially equally as $\lambda_L$. Thereby, again "active" or "passive" control of temperature dependent spectral shift of the filter characteristic may be realized.

Both "passive" and "active" control have become clear to the skilled artisan from previous explanations so that in FIG. 10 both possibilities are addressed merely by the mechanical loading signal $m_1(\theta)$.

Figure 11:
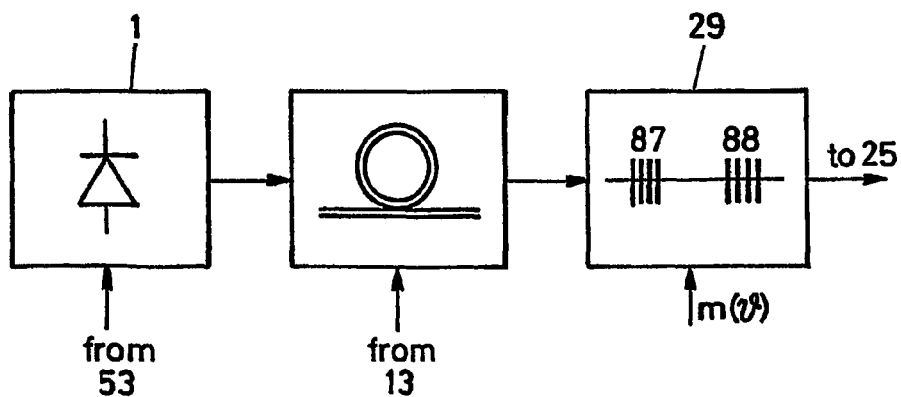
FIG. 11 by means of a part of the laser system as of FIG. 1 a possible form of realizing the principle as of FIG. 10 at the laser system as of FIG. 1.

The principle of the system of FIG. 10 is e.g. realized in the system of FIG. 1 as shown in FIG. 11. Thereby the ASE filter unit 29 is conceived with a fibre grating low-pass stage 87 and a fibre grating high-pass stage 88 in analogy to FIG. 9. Again, "passive" or "active" control may be applied so as to spectrally shift the pass-band centre frequency in dependency of temperature $\theta$ matched with the temperature shift of laser wavelength $\lambda_L$. Clearly here too, and with an eye on FIG. 7 or FIG. 4 a stabilizing filter may be provided and temperature shift of that filter matched with temperature shift of ASE filter 29.

We have described in this chapter according to one aspect of the present invention a technique by which the impact of laser light wavelength temperature shift is remedied not by stabilizing the temperature at the laser source but by matching the addressed temperature shift and the temperature shift of the spectral location of downstream filter characteristics. Due to the fact that the addressed matching technique may make cooling or temperature control circuits superfluous it is most apt to be applied for laser systems whereat high compactness, low power consumption and robustness is a predominant requirement. These requirements are especially encountered for laser systems which are at least in part conceived by optical fibre on one hand, to be most flexible in construction leading to increased compactness and which are, due to this advantage, most suited for handheld or portable equipment which also require low power consumption and high robustness. A high advantage with respect to compactness is thereby achieved by a substantially all optical fibre laser system as has been disclosed in context with FIG. 1, specifically but not exclusively suited for portable laser range finders or target designators. Nevertheless the addressed matching technique may also be used more generically and as was described for all kind of laser systems where a relative shift of laser wavelength and spectral position of a downstream filter characteristic is a problem and where the wavelength shift per se is acceptable.

3. Modulated Amplifier

In context with the laser system as realized today and as has been described with a help of FIG. 1 we have addressed pulsing operation of the laser diode 3 and pulsing pumping of the optical fibre amplifier stages 7, 25 and possibly 39, whereby pumping of the addressed fibre amplifier stages is synchronized with pulsing of the laser diode 3.

We consider more generically the technique of pulsing operation of a laser source and of pulsing pumping of a downstream optical amplifier thereby synchronizing such pulsing operations. These aspects shall further be exemplified in this chapter.

Varying pulsed amplifier pumping as for synchronizing purposes may be considered under a broader aspect namely of gain modulating the optical amplifier on one hand, on the other hand doing so at least in part synchronized with pulsing the laser source. Thereby such a technique may be applied per se to a laser system or in combination with one or more than one of the other aspects considered inventive.

Figure 12:
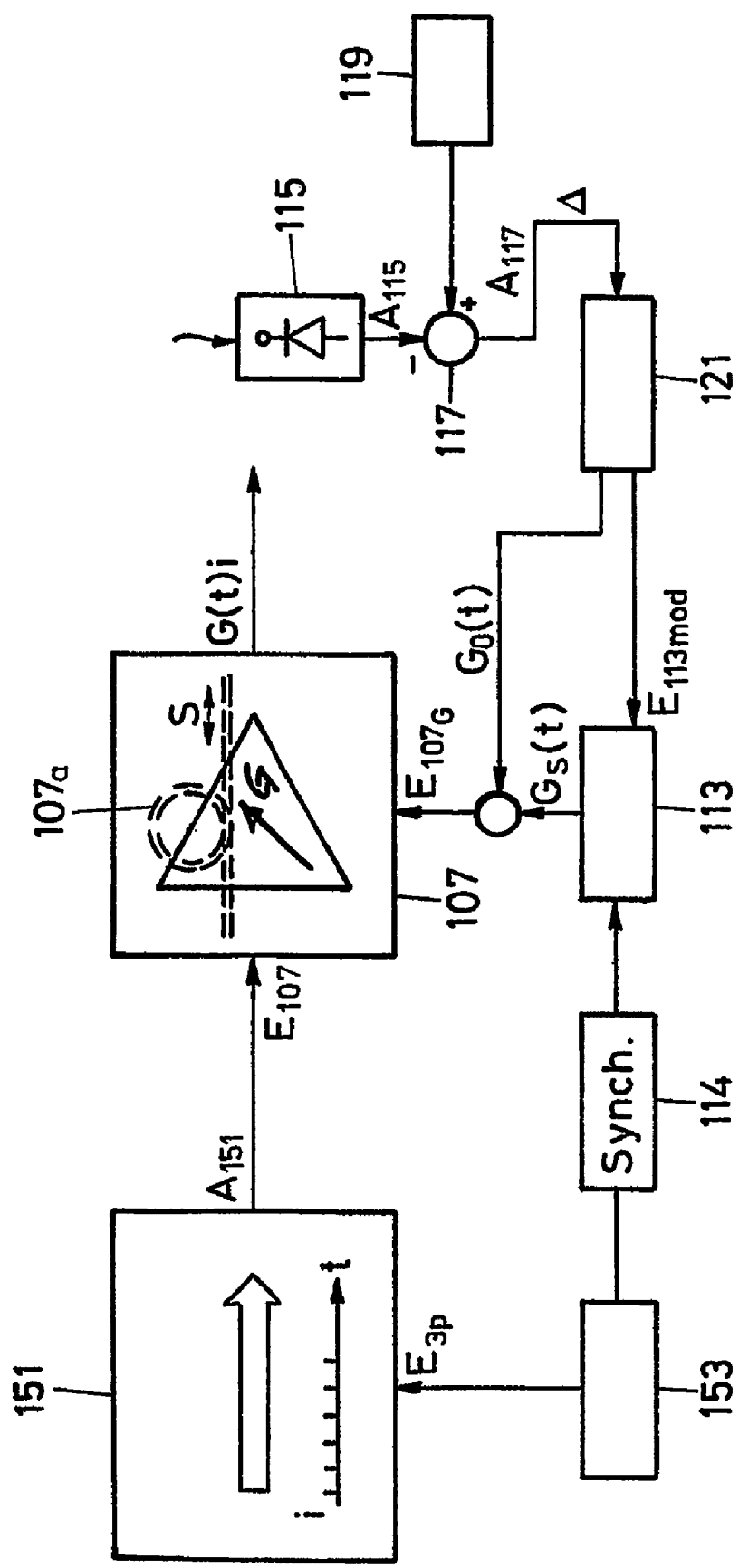
FIG. 12 by means of a simplified signal-flow/functional-block diagram a laser system with gain modulated optical amplifier.

According to FIG. 12 a laser source 151 is operated to emit pulsed laser light which is controlled by a pulse-control unit 153 via a pulse control input $E_{3P}$ to laser source 151. The pulsed laser light emitted at the output $A_{151}$ is operationally fed to the input $E_{107}$ of an optical amplifier stage 107. The amplifier stage 107 is gain modulated. Gain modulation is controlled by a modulation control unit 113 via gain control input $E_{107G}$ to amplifier stage 107. At the output of amplifier stage 107 there is emitted gain modulated pulsed laser light as indicated in FIG. 12 by G(t)i wherein i is the pulsed laser light emitted from laser source 151. Thereby operation of the gain control unit 113 i.e. variation of the gain G(t) at the amplifier stage 107 is at least in part synchronized with pulsed operation of laser source 151 as shown in FIG. 12 by the synchronizing unit 114.

The modulated gain G(t) may be a composite gain signal consisting of a possibly time varying gain component $G_O(t)$ which is not synchronized with the pulsed light emitted from laser source 151 and with a component $G_S(t)$ which is synchronized with the addressed pulsed operation.

Figure 13:
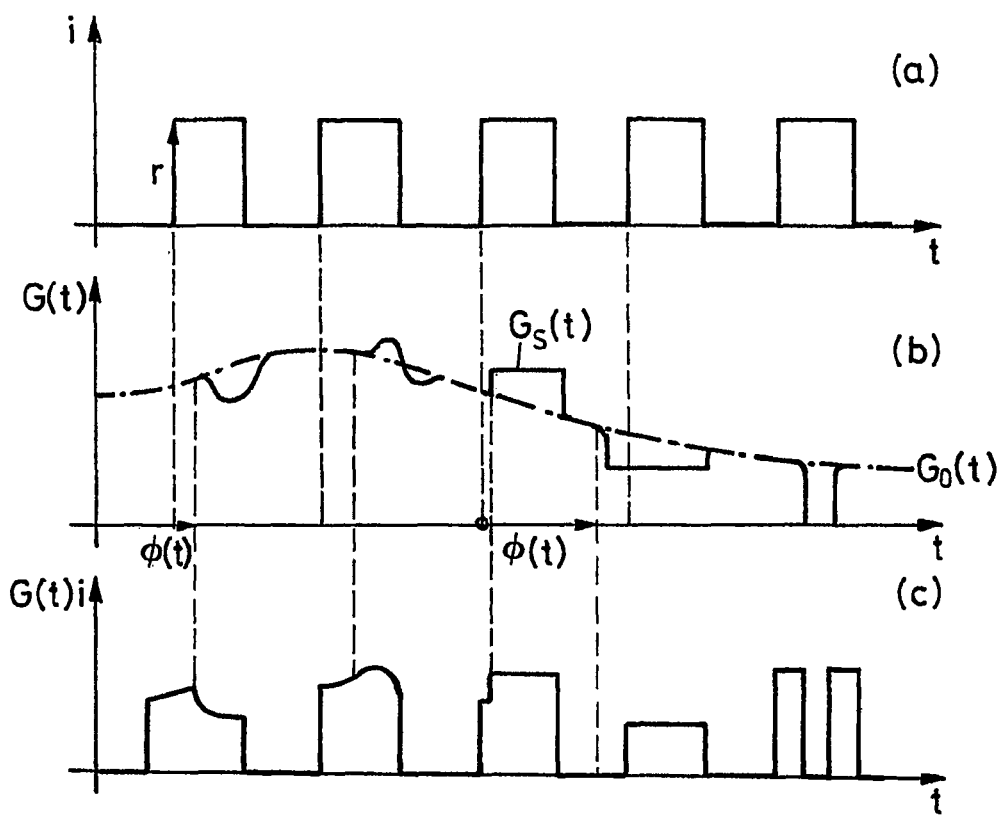
FIG. 13 purely qualitatively, pulsed laser light (a), modulated gain (b) of an amplifier for the addressed laser light and laser light resulting from gain modulated gain (c)

In FIG. 13, purely as an example, there is shown pulsed laser light i (a), a qualitative gain-course $G(t)=G_O(t)+G_S(t)$ as modulated at the amplifier stage 107 and (c) the resulting pulsed light G(t)·i.

As may be seen from FIG. 13 gain modulation comprises an unsynchronized gain component $G_O(t)$ and, superimposed thereon, a synchronized component $G_S(t)$. Synchronization is e.g. based on the rising edge r of the laser pulses i and is set by the phasing Ø(t). The synchronizing phase Ø(t) may thereby be time-invariant or may be varying in time. As may be seen from FIG. 13 by the controlled synchronized modulation of the gain G of the optical amplifier stage 107 the time course of laser pulses at the output of the amplifier stage may be most flexibly varied.

These are different reasons for time-varying energy of the laser pulses emitted from laser source 151. In chapter "2. Temperature shift matching" we have discussed how relative spectral shifts between the wavelength $\lambda_L$ of the laser light and a filter characteristic e.g. of a narrow pass-band optical filter, may significantly affect the energy of output laser light at $\lambda_L$ and S/N. There we have discussed the approach of temperature shift matching of the wavelength $\lambda_L$ of laser light and spectral position of downstream filter-characteristic so as to cope with the addressed problem. Instead of this approach or in addition thereto, the output laser energy downstream the amplifier stage 107 as schematically shown in FIG. 12 may be watched and a undesired decrease or increase of such energy e.g. due to the addressed mutual shifts may be compensated. Thereby the technique considered here namely of gain modulation allows to cope more generically with undesired output energy variations irrespective of their upstream origin.

Further targets which may be aimed at by the addressed gain modulation technique are maximum S/N, optimized output pulse-energy versus electrical input power, i.e. optimized wall-plug efficiency.

With respect to modulating gain of the optical amplifier stage different possibilities may be applied in dependency of the type of such optical amplifier stage.

Commonly an optical amplifier for laser light is a pumped amplifier as was already addressed in context with FIG. 1.

Thereby at a pumped optical amplifier the addressed gain modulation may be controlled by controlling pump light energy and/or pump light wavelength. A further possibility for gain control is to provide at the optical amplifier an optical filter characteristic and to perform gain modulation by spectrally shifting the filter characteristic as was discussed for various optical filters in chapter "2. Temperature shift matching" especially in context with the "active" mode. It is perfectly clear to the skilled artisan that by providing within the amplifier stage 107 an optical filter as was described in the addressed chapter and controllably spectrally shifting its filter characteristic the gain of the amplifier stage 107 may be controllably modulated. Further for pumped amplifiers, the optical length of excited "active" material may be modulated which length directly affects the gain of the amplifier stage.

In FIG. 12 there is further shown a sensing arrangement 115 which senses, downstream the gain-modulatable amplifier stage 107 one or more than one parameters of the pulsed laser light. Such sensing arrangement 115 may e.g. sense actual S/N, pulse energy or averaged pulse energy. The sensed actual value of interest represented by an electric signal at output $A_{115}$ is compared at a comparator unit 117 with a desired value of interest or a respective time course pre-established in storage unit 119. At the output $A_{117}$ of comparator unit 117 a signal-difference Δ is generated which controls, via a controller-unit 121, modulation of the gain of amplifier stage 107 at modulation control input $E_{113mod}$ and/or controls the gain value $G_O(t)$, i.e. the non-synchronized part of amplifier gain G(t). Thereby a negative feedback control for the desired entity at the laser light downstream amplifier stream 107 is established. Clearly instead of providing negative feedback control of the addressed parameters in the laser light downstream the amplifier stage 107 it is also possible to provide open-loop control by adjusting the synchronized component of the gain modulation at $E_{113mod}$ and/or by adjusting the un-synchronized gain modulation $G_O(t)$.

As we have already addressed, providing a gain modulatable optical amplifier stage downstream the laser source allows to substantially compensate temperature caused variations of laser output energy and of S/N. Thereby similarly to the effects of the previously addressed temperature shift matching technique, significant efforts for temperature stabilization especially of the laser source are avoided. This improves the overall laser system with respect to compactness and power consumption. Such requirements prevail especially for portable or even handheld equipment whereat such a laser system is integrated.

We have already addressed such a laser systems in context with FIG. 1 as well as—more generically—in context with laser systems at least in part conceived in optical fibre technique which especially comprise one or more than one pumped optical fibre amplifier stages. The technique addressed here of gain modulating an optical amplifier stage downstream the laser source is especially suited for such highly compact and low power consumption laser systems with pumped optical fibre amplifier stages.

This is addressed in FIG. 12 by the dash line representation of pumped optical fibre amplifier $107_a$. Thereby and as was already mentioned gain modulation of such pulsed optical fibre amplifier stage 107 may be achieved by means of varying the intensity of pumping light and/or varying the spectrum of pumping light and/or shifting spectrally the filter characteristic of an optical filter within the amplifier stage and/or varying the length of actively amplifying material instead or additionally to modulating the addressed gain by pump-pulse-width modulation.

Figure 14:
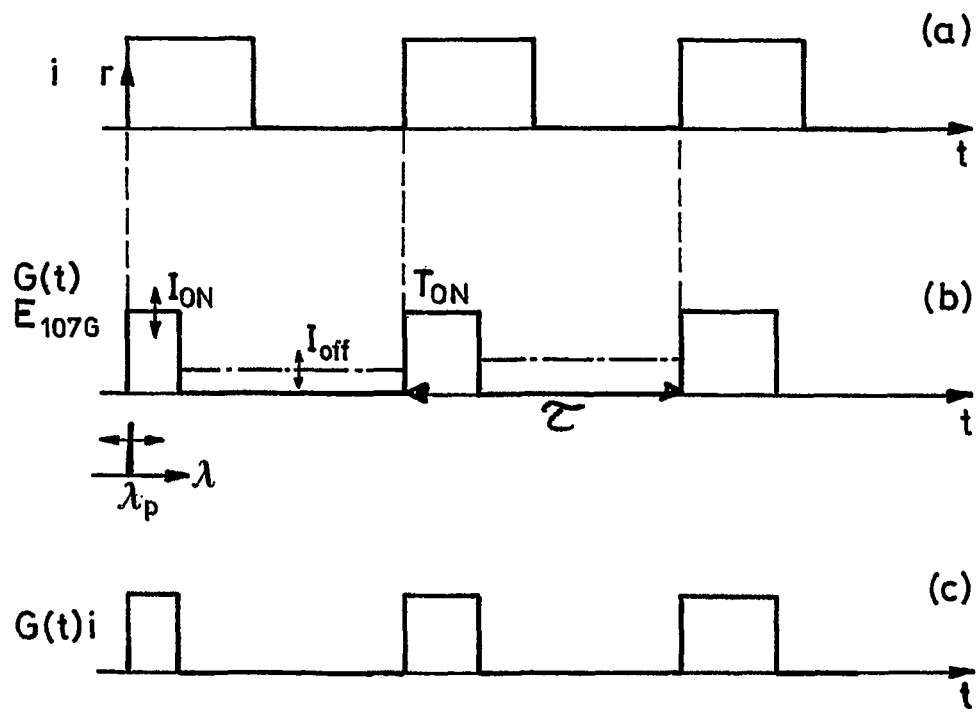
FIG. 14 pulsed laser light (a) amplified by pulse-width-modulated gain (b) of an optical amplifier and the result laser light (c)

In FIG. 14 there is shown qualitatively pulse width modulated pumping of the optical amplifier stage as of 107 or 107a of FIG. 12. In analogy to the representation in FIG. 13 "i" denotes the laser light pulses emitted at the output $A_{151}$ of FIG. 12. The amplifier stage 107 or 107a is pumped in that pumping light pulses are applied to gain control input $E_{107G}$. Thereby the pumping pulses as of (b) in FIG. 14 are synchronized with the laser light pulses "i" as e.g. with varying time lag Ø(t) (see FIG. 13) based on the rising edge r of the laser light pulses "i". Gain modulation is performed by pulse-width-modulation of the pumping pulses whereby as shown in (b) of FIG. 14 the duty-cycle defined by the on-time $T_{ON}$ to the pulse repetition period τ is controllably varied. The resulting laser light pulses are shown in (c). As further shown in FIG. 14 gain modulation may additionally to pulse-width-modulation be controlled by pumping pulse intensity $I_{ON}$ and/or $I_{Off}$, spectrum of the pumping light represented in FIG. 14 by the wavelength $\lambda_P$ and/or as shown in FIG. 12, by geometric variation of the length of absorbing material 5.

Figure 15:
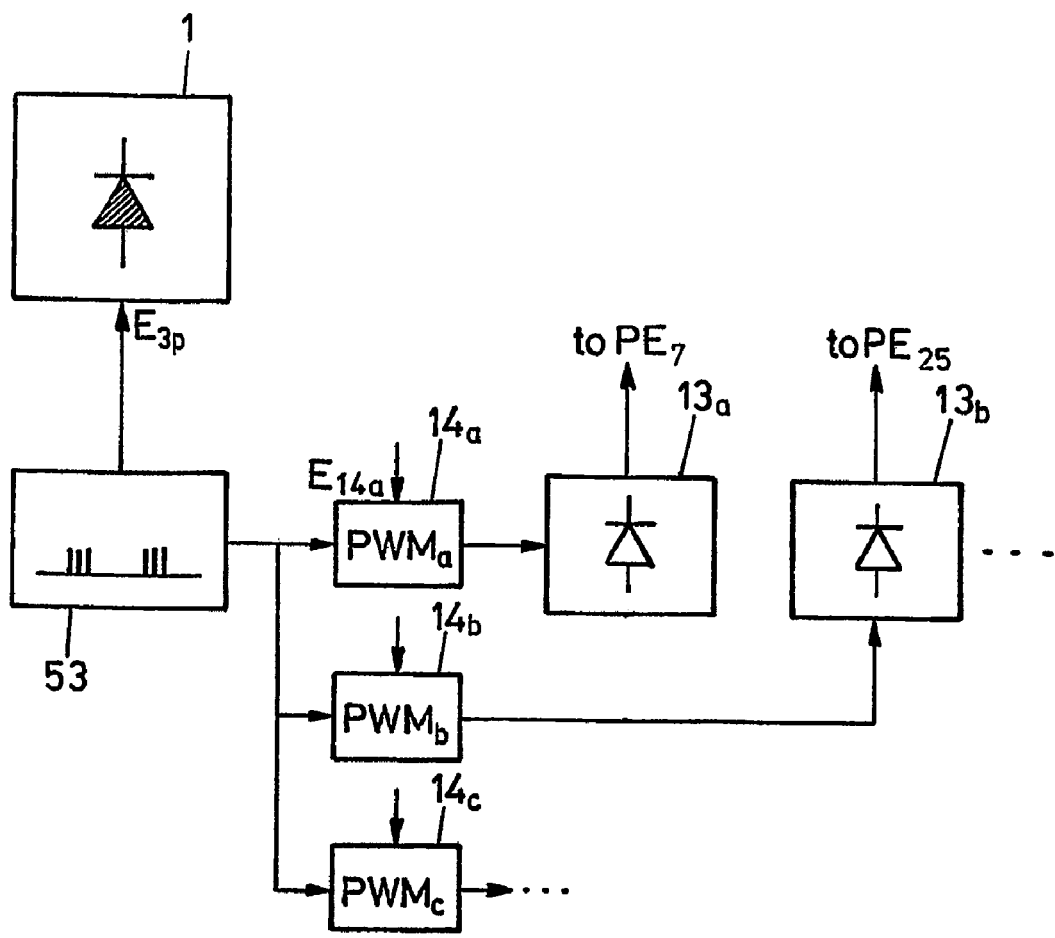
FIG. 15 a part of the laser system as of FIG. 1, whereat pulse-width-modulation as of FIG. 14 is applied.

In FIG. 15 there is shown a part of the laser system as of FIG. 1. Thereby pumping of the one or more than one of the amplifier stages 7, 25 and possibly 39 is performed in pulse-width-modulation technique as it was addressed in context with FIG. 14. Thereby and synchronized with the laser control pulses from unit 53, separate pulse-width-modulation units 14a, 14b . . . control the pulsed pumping of the fibre amplifier stages 7, 25 and possibly 39 via pumping diodes 13a, 13b, etc.

The pulse-width-modulation at the respective units 14 may thereby be open-loop adjusted or, with an eye on FIG. 12, negative feedback controlled from a sensing unit 115. The pulse-width-modulation control is done by a respective control signal to the modulation control inputs $E_{14mod}$. Thereby, the pulse-width-modulation for the respective pumping of the amplifier stages may be set differently as addressed by the separate modulation units 14a, 14b assigned to the pumping diodes 13a, 13b . . . . The difference between setting of the pulse-width-modulations takes into account e.g. different locations of the pulsed amplifier stages along the laser light path. The difference may be with respect to synchronization phasing $\phi(t)$ as of FIG. 13 as well as with respect to gain control parameters. Instead of pumping diodes 13a, b . . . other pumping sources as e.g. pumping laser sources may be used. Further instead of a diode laser source 1 other laser source types may be used as e.g. solid state laser sources.

By means of the modulatable gain G of the optical amplifier as described in this chapter it most generically becomes possible to counter-act laser light intensity variations which are due e.g. to temperature influence or to aging of the system. The addressed technique is most suited to be integrated in the laser system as of FIG. 1, more generically for laser systems as addressed namely for portable or even handheld equipment as for handheld laser range finders and target designators which have already been addressed.

4. Bi-Directional Coupler

In context with FIG. 1 we have addressed a coupler unit 49 which is considered under a further aspect of the present invention as inventive per se.

Figure 16:
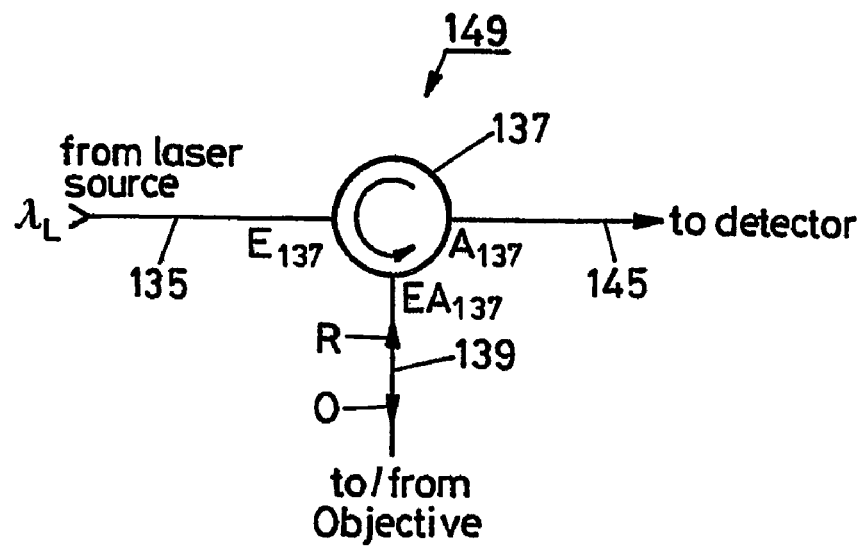
FIG. 16 an all-fibre coupling device in a simplified and schematic representation for bi-directional laser emission/reception and as integratable in the system of FIG. 1.

Such coupler unit 149 is more generalized shown in FIG. 16. It comprises an input optical fibre or waveguide 135 to an input $E_{137}$ of a circulator 137. The input fibre 135 is to be connected to a laser source. The output $A_{137}$ of circulator 137 is connected to an output optical fibre 145 to be connected to a detector unit as to a unit 43 of FIG. 1. The input/output $EA_{137}$ of circulator 137 is connected via fibre 139 to the objective of a laser device. Laser light from the laser source is coupled by the circulator 137 as output light O to fibre 139 and to the objective whereas the laser light R received at the objective e.g. reflected from a target is coupled by circulator 137 from fibre 139 via fibre 145 to the detector unit.

Different possibilities exist for the selection of the fibres 135, 139 and 145.

In one embodiment all these fibres are standard single mode fibres at the wavelength $\lambda_L$ of the laser light from the laser source. Thereby the overall losses are minimized. The laser light is only guided in the core of the fibres. Thereby the aperture of the light emitting and of the light receiving optics of the objective are selected equal. The optimum aperture width F/# of the objective may be adapted to the divergence of the fibre 139. Further the detection surface of the detector unit may be adapted to the mode filed diameter MFD of fibre 145.

In a further embodiment wherein all the fibres 135, 139 and 145 are selected as standard single-mode fibres at the laser wavelength $\lambda_L$, the emitted light O is only guided in the core of fibre 135 and 139. The received light R is guided in the core as well as in the cladding of fibres 139 and 145. Thereby especially fibres 139 and 145 are selected short so as to minimize losses in the claddings to a negligible amount. The detection surface of detector unit downstream fibre 145 is to be adapted to the cladding size of that fibre. Coupling losses of the received light R is minimized. The numerical aperture of the emitter is selected different from the numerical aperture of the receiver at the objective.

In a further embodiment fibre 135 is optimized with respect to the laser source and fibres 139 and 145 are few mode. As the length of fibre 139 is selected short and this fibre is substantially un-bended, coupling from the fundamental to higher order modes can be neglected and optimum beam quality is achieved. Still in a further embodiment fibre 135 is optimized with respect to the laser source and fibre 139 is a double clad fibre which has the same core MFD as fibre 135. Fibre 145 is optimized to collect the light guided in the cladding and in the core of fibre 139.

In a further embodiment the fibres 135, 139 and 145 are multi-mode fibres.

If the laser source is a source of polarized laser light, in a further embodiment the fibres are selected as polarization maintaining fibres. This simplifies separation of emitted -O- and received -R- light.

In a further embodiment photonic crystal fibres, single or double-clad, are used which allows high flexibility with respect to the choice of the MFD parameters for emitted -O- and received -R- light.

Commercially available un-polarized circulator units 137 may be adapted to the different fibres as mentioned. Often manufacturers of circulators impose the parameters of fibres to be applied. Therefore, as was already addressed in context with FIG. 1, fusion splicing of the optimum fibres to the circulator fibres is to be performed in order to minimize losses.

The circulator unit 137, in one embodiment is a polarization independent circulator which separates the received light R from the transmitted light O and thereby additionally removes background light by filtering.

The all-fibre coupler unit 149 or 49 of FIG. 1 has the advantage that it may be applied with un-polarized laser light as especially suited for the addressed range finder and target designator portable applications. No detection limitation due to a coaxial surface ratio, defined as emitter or receiver surface, to total objective surface or due to polarization state of the received light is present.

The application of MFD adaptation at the fibre-139-end of the all-fibre device allows realizing optimal beam divergence of the device with the coupler unit 149 or 49 as of a range finder or a target designator without providing additional lenses. An increase of MFD increases reliability at the end of fibre 139.

The MFD of the fibre 139 directly determines the numerical aperture at that fibre end and is influenced by the geometry and/or refractive index of the wave guiding fibre. The numerical aperture of the fibre end determines the beam side output by the objective and thus the divergence of the laser beam emitted by the device as by a range finder or by a target designator device. Therefore the choice of MFD at the end of fibre 139 influences the performance of such device. In spite of the fact that optimum emitted beam divergence may be achieved by placing optical lenses downstream the end of fibre 139 in one embodiment of the coupler 149 and 49—as was mentioned—adaptation of the MFD is performed at the end of fibre 139 opposite to circulator 137 which allows the omission of additional lenses. Different techniques are known to alter and thus optimize the MFD of such fibre 139:

An increase of MFD can be achieved by diffusion of dopants obtained by heating the fibre in a flame according to J. of Appl. Phys.; Vol. 60 No. 12 pp. 4293, 1986, K. Shigihara et al. or J. Lightwave Technol. Vol. 8 No. 8 pp. 1151, 1990, K. Shiraishi et al. or Electron. Lett. Vol. 24 No. 4 pp. 245, 1988 J. S. Harper et al.

Another known possibility is irradiating the fibre with a $CO_2$ laser according to Appl. Opt. Vol. 38 No. 33, pp. 6845, 1999; T. E. Dimmick et al.

Still a further known possibility to increase MFD of single mode fibres is to reduce the core diameter by tapering the fibre, Electron. Lett. Vol. 20 No. 15 pp. 621, 1984; Keil, R.

Further cladding modes have a higher beam diameter than core modes. Therefore coupling the core mode near the end of fibre 139 into a cladding mode allows significant changes in the numerical aperture. This effect has been investigated in Opt. Commun. Vol. 183 pp. 377, 2000; Y. Li et al.

Lensed fibre ends are presented in the publication of Jarmolik et al. Optik Vol. 110, No. 1, pp. 37 1999, A. Jarmilik et al. lensed fibre ends.

Generically an increase of the emitted beam diameter allows the applications of higher peak power.

A further technique to increase MFD at the end of fibre 139 is UV-irradiation of a photo-sensitive cladding at a fibre 'Spot size expander using UV-trimming of trilayer photosensitive fibres'; OECC/100C 2001, Conference Incorporating ACOFT, Sydney, pp. 408, 2001; R. A. Jarvis et al. or 'High-energy and high-peak-power nanosecond pulse generation with beam quality control in 200 μm core highly multimode Yb-doped fibre amplifiers'; Opt. Lett. Vol. 30 No. 4 2005; pp. 358; Cheng et al. It has further to be noticed that core-less fibre end caps may be applied to the end of fibre 139 so as to completely eliminate surface damages, as known from US-20040036957 (A. Galvanauskas et al.).

Thus the coupler unit 149 or 49 as of FIG. 16 provides single channel laser light emission and reception for polarized or un-polarized laser light. It is ideally suited to be combined with diode or solid state laser sources making use of optical fibre coupling technique as especially for an all-fibre laser system as of an all-fibre MOPA laser system as was described with a help of FIG. 1. Thereby optical fibre based laser systems guarantee an increased stability and robustness with respect to environmental disturbances in comparison to systems with free space parts. Such laser systems may have a very high compactness and the availability of the output beam as well as of the reception beam in a fibre tail allows substantially independent location of the input/output laser port at a respective device with such laser system.

Single channel emitting/receiving optics further increase compactness allowing for high system stability. Thereby the all-fibre reception channel to the detector diode couples only light which is present within the fibre to such diode whereby stray-light impinging upon such diode is reduced.

We have described a today's realized embodiment of an all-fibre laser system wherein different features are realized in combination. All these features as especially temperature shift matching, gain modulation of optical amplifiers and bi-directional optical coupler unit are considered per se inventive as being applicable per se or in any combination to laser systems which may differ from the system as realized today.

The invention claimed is:

1. A laser system comprising:
   a laser light source, having an output for emitting a laser beam from said laser light source;
   a light transmitter optics with an input;
   an optical fiber having one end connected to said input of said light transmitter optics and the other end of said optical fiber being operationally connected to the output of said laser light source and wherein the mode field diameter (MFD) of said one end of said optical fiber determines the divergence of a laser beam transmitted by said transmitter optics.

2. The laser system of claim 1, further comprising:
   a light receiver optics combined with said light transmitter optics to form a light transmitter and receiver optics;
   an output/input coupler unit including a circulator with an input, an output and an output/input;
   a detector unit with an input;
   wherein the input of said circulator is operationally connected to said output of said laser light source, the output of said circulator is operationally connected to said input of said detector unit, said output/input of said circulator is operationally connected to said light transmitter and receiver optics by an optical fiber including said optical fiber and wherein said input to said circulator and said output from said circulator are further optical fibers.

3. The laser system of claim 1, wherein said laser light source includes a master-oscillator/power-amplifier laser arrangement.

4. The laser system of claim 1, wherein said laser light source includes a laser diode.

5. The laser system of claim 1, wherein said laser light source is a pulsed laser light source.

6. The laser system of claim 1, further comprising an active optical fibre power-amplifier with an input and an output, the input of said active optical fibre power amplifier being operationally connected to said output of said laser light source and the output of said active optical fibre power-amplifier being operationally connected to the input of said light transmitter optics.

7. The laser system of claim 6, wherein said active optical fibre power-amplifier is pumped.

8. The laser system of claim 7, further comprising a pumping diode for pumping said active fibre power amplifier.

9. The laser system of claim 6, wherein said active optical fibre power-amplifier is gain-modulated.

10. The laser system of claim 6, wherein said active optical fibre power-amplifier is pumped and is gain-modulated by at least one of intensity of pumping light, spectrum of pumping light, pumping pulse width of pumping light, length of active fibre, spectral shift of an optical filter characteristic.

11. The laser system of claim 2, wherein said laser light source is pulsed, said system further comprising an evaluation unit with an input operationally connected to an output of said detector unit and performing evaluation on detected multiple laser pulses.

12. The laser system of claim 1, further comprising an active fibre power-amplifier with an input operationally connected to said output of said laser light source and with an output operationally connected to said input of said light transmitter optics, said active fibre power-amplifier being pumped in a pulsed mode, said laser light source being operated in a pulsed manner and said pulse mode being time-synchronized with said pulsed operation of said laser light source.

13. The laser system of claim 1, further comprising a negative feedback control loop, and an active fibre power-amplifier with an input operationally connected to said output of said laser light source and with an output operationally connected to said input of said light transmitter optics, said active fibre power-amplifier being gain-modulated, said active fibre power-amplifier being an adjusting member within said negative feedback control loop, whereat a physical entity of the laser beam downstream said active fibre power-amplifier is sensed as a measured value to be controlled and is compared with a desired value and gain of said active fibre-power amplifier is adjusted in dependency of a result of said comparing.

14. The laser system of claim 13, wherein said physical entity sensed is one of signal-to-noise ratio and of intensity of laser light.

15. The laser system of claim 1, further comprising:
an active fibre power-amplifier with an input operationally connected to said output of said laser light source and with an input operationally connected to said input of said light transmitter optics; and
an optical fibre filter operationally interconnected between said output of said active fibre power-amplifier and said input of said light transmitter optics, said filter having a filter characteristic the spectral position of which is controllably shiftable.

16. The laser system of claim 15, wherein said filter characteristic is shiftable in dependency of a temperature.

17. The laser system of claim 16, wherein said temperature is dependent from a temperature of said laser light source.

18. The laser system of claim 1, further comprising an active fibre power-amplifier with an input operationally connected to said input of said laser light source and an output operationally connected to said input of said light transmitter optics; and
a stabilizing optical fibre filter in said laser light source and a downstream optical fibre filter using an input operationally connected to said output of said active fibre power-amplifier and with an output operationally connected to said input of said light transmitter optics, the spectral location of respective filter characteristics of said stabilizing and of said downstream optical filters being controllably shiftable and being matched.

19. The laser system of claim 2, wherein said fibres at said input of said circulator as well as at said output of said circulator as well as at said output/input of said circulator are standard single-mode fibres at a wavelength of laser light from said laser light source.

20. The laser system of claim 19, wherein the numerical apertures of said light transmitter and receiver optics are equal.

21. The laser system of claim 19, wherein laser light from said laser source is guided in the core of said fibres at said input and said output/input of said circulator and received laser light is guided in the core and in the cladding of said fibres at said output/input of said circulator and at said output of said circulator.

22. The laser system of claim 21, wherein the numerical apertures of said transmitter and receiver optics, are selected different.

23. The laser system of claim 2, wherein said fibres at said input, output and output/input of said circulator are multimode fibres.

24. The laser system of claim 2, wherein said fibres at said input, output and output/input of said circulator are polarisation maintaining fibres and said laser light source generates polarised laser light.

25. The laser system of claim 2, wherein at least one of said fibres at said input, said output and said output/input of said circulator is selected from the group consisting of Photonic crystal fibre, single-clad fibre, and double-clad fibre.

26. The laser system of claim 2, wherein said circulator is an un-polarized circulator.

27. The laser system of claim 2, wherein at least one of said fibres at said input, output, output/input of said circulator is fusion spliced to fibres of said circulator.

28. The laser system of claim 1, further comprising a light receiver optics, and, wherein said transmitter optics and said receiver optics are separate units.

29. The laser system of claim 1, wherein the laser system is in the form of a portable device.

30. The laser system of claim 29, wherein the portable device is handheld.

31. The laser system of claim 1, wherein the laser system is applied in a range finder or target designator unit, operating in a range from up to at least 1 km throughout up to a range of at least 10 km.

32. The laser system of claim 1, wherein laser light is substantially exclusively guided in the system in optical fibres.

33. A method for producing a laser beam out of a transmitter optic comprising generating laser light in an optical fibre having an end operationally coupled to said transmitter optic and determining the divergence of said laser beam by the mode field diameter (MFD) of said end.

* * * * *